United States Patent
Ryu et al.

(10) Patent No.: US 12,410,203 B2
(45) Date of Patent: Sep. 9, 2025

(54) ORGANOMETALLIC ADDUCT COMPOUND AND METHOD OF MANUFACTURING INTEGRATED CIRCUIT USING THE SAME

(71) Applicant: SAMSUNG ELECTRONICS CO., LTD., Suwon-si (KR)

(72) Inventors: Seungmin Ryu, Hwaseong-si (KR); Jaewoon Kim, Seoul (KR); Gyuhee Park, Hwaseong-si (KR); Younjoung Cho, Hwaseong-si (KR); Kazuya Saito, Tokyo (JP); Takanori Koide, Tokyo (JP); Yoshiki Manabe, Tokyo (JP); Yutaro Aoki, Tokyo (JP); Hiroyuki Uchiuzou, Tokyo (JP); Wakana Fuse, Tokyo (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1062 days.

(21) Appl. No.: 17/193,531

(22) Filed: Mar. 5, 2021

(65) Prior Publication Data
US 2021/0284667 A1  Sep. 16, 2021

(30) Foreign Application Priority Data

Mar. 16, 2020 (KR) .......... 10-2020-0032285
Aug. 6, 2020 (KR) .......... 10-2020-0098822

(51) Int. Cl.
C07F 9/141 (2006.01)
C23C 16/18 (2006.01)

(52) U.S. Cl.
CPC ............ *C07F 9/1411* (2013.01); *C23C 16/18* (2013.01)

(58) Field of Classification Search
CPC ..................................................... C23C 16/18
See application file for complete search history.

(56) References Cited

U.S. PATENT DOCUMENTS 8,142,847 B2  3/2012  Shenai-Khatkhate et al.
8,329,583 B2  12/2012  Dussarrat
(Continued)

FOREIGN PATENT DOCUMENTS

EP      2902398 A1   8/2015
JP   2017114850 A   6/2017
(Continued)

OTHER PUBLICATIONS

Marchetti et al; Complexes of Niobium(V) and Tantalum(V) Halides with Ligands that Contain N-C=O and P=O functionalities: A Synthetic and Structural Study; Eur. J. Inorg. Chem. 2008; pp. 453-462 (Year: 2008).*

(Continued)

*Primary Examiner* — Mandy C Louie
(74) *Attorney, Agent, or Firm* — Muir Patent Law, PLLC

(57) ABSTRACT

An organometallic adduct compound and a method of manufacturing an integrated circuit (IC) device, the organometallic adduct compound being represented by General formula (I):

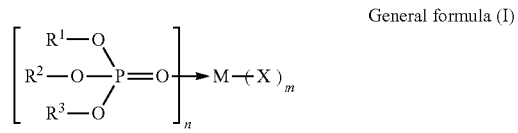

General formula (I)

in General formula (I), $R^1$, $R^2$, and $R^3$ are each independently a C1 to C5 alkyl group, at least one of $R^1$, $R^2$, and $R^3$ being a C1 to C5 alkyl group in which at least one hydrogen atom is substituted with a fluorine atom, (Continued)

M is a niobium atom, a tantalum atom, or a vanadium atom, X is a halogen atom, m is an integer of 3 to 5, and n is 1 or 2.

17 Claims, 16 Drawing Sheets

(56) References Cited

U.S. PATENT DOCUMENTS

| | | | |
|---|---|---|---|
| 8,460,989 | B2 | 6/2013 | Blasco et al. |
| 10,023,462 | B2 | 7/2018 | Lansalot-Matras et al. |
| 10,134,582 | B2 | 11/2018 | Ryu et al. |
| 10,259,836 | B2 | 4/2019 | Lim et al. |
| 2003/0082296 | A1 | 5/2003 | Elers et al. |
| 2006/0223300 | A1* | 10/2006 | Simka ............... H01L 21/76862 257/E21.171 |
| 2012/0264936 | A1* | 10/2012 | Inoue ................. C07F 15/0086 544/225 |
| 2018/0362551 | A1 | 12/2018 | Dilocker et al. |

FOREIGN PATENT DOCUMENTS

| | | |
|---|---|---|
| JP | 6615237 B2 | 12/2019 |
| KR | 1020110081181 B1 | 3/2016 |
| KR | 10-2017-0063092 A | 6/2017 |
| KR | 10-2020-0132639 A | 11/2020 |
| KR | 1020170073947 B1 | 1/2024 |

OTHER PUBLICATIONS

Zinov'eva, E. G., et al. "Synthesis And Structure Of Tris (Halo) Alkyl Phosphate Complexes With Metal Chlorides.", Russian Journal of General Chemistry. vol. 78, No. 8, pp. 1509-1514. (2008).

Korean Office Action dated Aug. 11, 2023, of the corresponding KR Patent Application No. 10-2020-0098822.

Bridgland, B. E., and W. R. McGregor. "The reaction of vanadium and titanium (IV) chlorides with some ligands containing P-O or As-O groups." Journal of Inorganic and Nuclear Chemistry 32.5 (1970): 1729-1735.

Favez, Christian MP, and André E. Merbach. "Adducts of Niobium (V) and Tantalum (V) Halides. XV. Ligand Exchange of the Adducts with Some Phosphoryl Compounds." Helvetica Chimica Acta 60.8 (1977): 2695-2702.

Favez, Christian MP, Henri Rollier, and Andre E. Merbach. "Adducts of niobium (V) and tantalum (V) halides. XIV. Structure and relative stability of the adducts with some phosphoryl compounds." Helvetica Chimica Acta 59.7 (1976): 2383-2392.

Notice Of Allowance dated Feb. 5, 2024 for corresponding application No. KR 10-2020-0098822.

Valloton, Mario, and André E. Merbach. "Electron Transfer Spectra of Some Adducts of Niobium (V), Tantalum (V), Titanium (IV) and Zirconium (IV) Halides with Lewis Bases." Helvetica Chimica Acta 58.8 (1975): 2272-2283.

First OA dated Dec. 6, 2024 for corresponding CN Patent Application No. 202110210695.6.

Sanhoury, Med Abderrahmane K., Med Taieb Ben Dhia, and Med Rachid Khaddar. "Synthesis, characterisation and solution behaviour of fluoroalkyl phosphoryl complexes of tin tetrachloride." Inorganica Chimica Acta 362.10 (2009): 3763-3768.

Anhoury, M. A. et al., "Synthesis and characterization of tin tetrafluoride adducts with fluoroalkyl phosphoryl ligands, Journal of Fluorine Chemistry," 2013, vol. 146, pp. 15-18, DOI:10.1016/j.jfluchem.2012.12.012.

First Office Action dated Aug. 20, 2024 for corresponding JP Patent Application No. 2021-040520.

Marchetti, F. et al. "Complexes of niobium(V) and tantalum(V) halides with ligands that contain N-C=O and P=O functionalities: a synthetic and structural study," European Journal of Inorganic Chemistry, 2008, vol. 3, pp. 453-462, DOI:10.1002/ejic.200700911.

* cited by examiner

ORGANOMETALLIC ADDUCT COMPOUND AND METHOD OF MANUFACTURING INTEGRATED CIRCUIT USING THE SAME

CROSS-REFERENCE TO RELATED APPLICATION

Korean Patent Application No. 10-2020-0032285, filed on Mar. 16, 2020 in the Korean Intellectual Property Office, and Korean Patent Application No. 10-2020-0098822, filed on Aug. 6, 2020, in the Korean Intellectual Property Office, both entitled: "Organometallic Adduct Compound and Method of Manufacturing Integrated Circuit Using the Same," are incorporated by reference herein in their entirety.

BACKGROUND

1. Field

Embodiments relate to an organometallic adduct compound and a method of manufacturing an integrated circuit (IC) device using the organometallic adduct compound.

2. Description of the Related Art

In recent years, due to the development of electronic technology, the downscaling of semiconductor devices has rapidly progressed, and thus, patterns included in electronic devices have been miniaturized.

SUMMARY

The embodiments may be realized by providing an organometallic adduct compound represented by General formula (I):

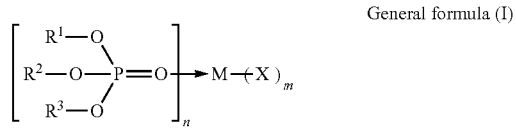

General formula (I)

wherein, in General formula (I), $R^1$, $R^2$, and $R^3$ are each independently a C1 to C5 alkyl group, at least one of $R^1$, $R^2$, and $R^3$ being a C1 to C5 alkyl group in which at least one hydrogen atom is substituted with a fluorine atom, M is a niobium atom, a tantalum atom, or a vanadium atom, X is a halogen atom, m is an integer of 3 to 5, and n is 1 or 2.

The embodiments may be realized by providing a method of manufacturing an integrated circuit (IC) device, the method comprising forming a metal-containing film on a substrate using an organometallic adduct compound represented by General formula (I),

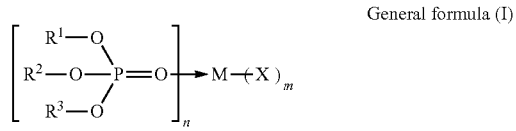

General formula (I)

wherein, in General formula (I), $R^1$, $R^2$, and $R^3$ are each independently a C1 to C5 alkyl group, at least one of $R^1$, $R^2$, and $R^3$ being a C1 to C5 alkyl group in which at least one hydrogen atom is substituted with a fluorine atom, M is a niobium atom, a tantalum atom, or a vanadium atom, X is a halogen atom, m is an integer of 3 to 5, and n is 1 or 2.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
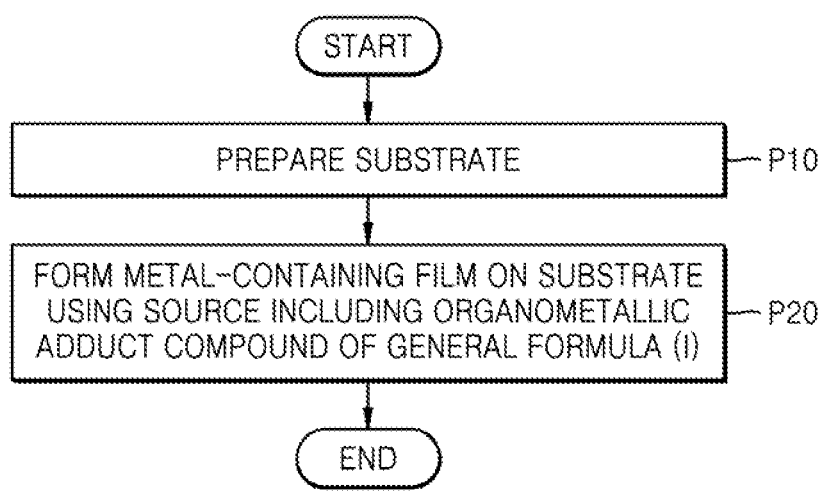
FIG. 1 is a flowchart of a method of manufacturing an integrated circuit (IC) device, according to embodiments.

When the term "substrate" is used herein, it should be understood as either the substrate itself or a stack structure including the substrate and a predetermined layer or film formed on a surface of the substrate. When the expression "a surface of a substrate" is used herein, it should be understood as either as an exposed surface of the substrate itself or an outer surface of a predetermined layer or film formed on the substrate. As used herein, the term "room temperature" or "ambient temperature" refers to a temperature ranging from about 20° C. to about 28° C. and may vary depending on the season.

The organometallic adduct compound according to the embodiment may have a structure in which an organic phosphate group is bonded in the form of an adduct to a coordination metal compound. The organometallic adduct compound according to the embodiment may be represented by the following General formula (I).

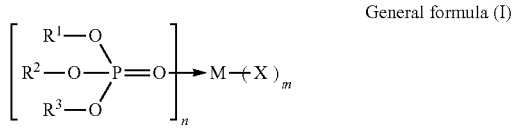

General formula (I)

In General formula 1, $R^1$, $R^2$, and $R^3$ may each independently be or include, e.g., a C1 to C5 alkyl group (e.g., a substituted or unsubstituted C1 to C5 alkyl group). In an implementation, at least one of $R^1$, $R^2$, and $R^3$ may be a C1 to C5 alkyl group in which at least one hydrogen atom is substituted or replaced with a fluorine atom. M may be an element (e.g., a niobium atom, a tantalum atom, or a vanadium atom) selected from Group V elements of the periodic table, X may be a halogen atom, m may be an integer of 3 to 5, and n may be 1 or 2. As used herein, the term "or" is not an exclusive term, e.g., "A or B" would include A, B, or A and B.

In an implementation, at least one of $R^1$, $R^2$, and $R^3$ may be a straight-chain alkyl group (e.g., a straight-chain C1 to C5 alkyl group). In an implementation, at least one of $R^1$, $R^2$, and $R^3$ may be a branched alkyl group (e.g., a branched C3 to C5 alkyl group).

In an implementation, $R^1$, $R^2$, and $R^3$ may each be independently be or include, e.g., a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a neopentyl group, or a tert-pentyl group.

In an implementation, $R^1$, $R^2$, and $R^3$ may each be independently be or include, e.g., a trifluoromethyl group, a trifluoroethyl group, a hexafluoroisopropyl group, or a nonafluoro tert-butyl group.

In General formula (I), X may be a fluorine (F) atom, a chlorine (Cl) atom, a bromine (Br) atom, or an iodine (I) atom. When X is a fluorine atom or a chlorine atom, a melting point of the organometallic adduct compound may be further lowered, and a vapor pressure of the organometallic adduct compound may be further increased.

The organometallic adduct compound according to the embodiments may be a liquid at room temperature. When an organometallic adduct compound is a liquid at room temperature, the organometallic adduct compound may be easily handled. In General formula (I), when at least one of $R^1$, $R^2$, and $R^3$ is a branched alkyl group, the organometallic adduct compound may be advantageously put into or be in a liquid phase at room temperature. In an implementation, the organometallic adduct compound may be a liquid at room temperature at atmospheric pressure (e.g., 1 atm) or under pressure conditions that ensure that the compound is in the liquid phase.

In an implementation, in General formula (I), M may be a niobium atom or a tantalum atom, and X may be a fluorine atom or a chlorine atom.

In an implementation, in General formula (I), m may be 5, and n may be 1.

In an implementation, in General formula (I), M may be a niobium atom or a tantalum atom, X may be a chlorine atom, and $R^1$, $R^2$, and $R^3$ may each independently be a branched alkyl group.

In an implementation, in General formula (I), M may be a niobium atom or a tantalum atom, X may be a fluorine atom, and $R^1$, $R^2$, and $R^3$ may each independently be a branched alkyl group.

In an implementation, in General formula (I), M may be a niobium atom or a tantalum atom, X may be a chlorine atom, and $R^1$, $R^2$, and $R^3$ may each independently be an alkyl group in which all hydrogen atoms are substituted with fluorine atoms (e.g., a C1 to C5 perfluoroalkyl group).

In an implementation, in General formula (I), M may be a niobium atom or a tantalum atom, X may be a fluorine atom, and $R^1$, $R^2$, and $R^3$ may each independently be an alkyl group in which all hydrogen atoms are substituted with fluorine atoms.

The organometallic adduct compound according to an embodiment may have a structure in which an organic phosphate group is bonded in the form of an adduct to a coordination metal compound. The organometallic adduct compound may be used as a precursor of a metal during the formation of a metal-containing film using a chemical vapor deposition (CVD) process or an atomic layer deposition (ALD) process. In this case, when the organometallic adduct compound is stored in a container, the organic phosphate group may protect the coordinate metal compound by coordinate bonds. Also, when the organometallic adduct compound is transported to a deposition reaction chamber for forming the metal-containing film, the organometallic adduct compound may easily decompose due to a process temperature in the deposition reaction chamber and may not affect a surface reaction for forming the metal-containing film.

In an implementation, the organometallic adduct compound may be represented by the one of the following Formulae 1 to 16.

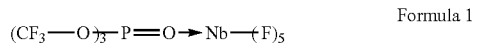

Formula 1

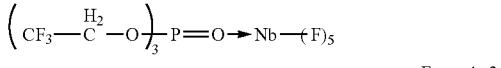

Formula 2

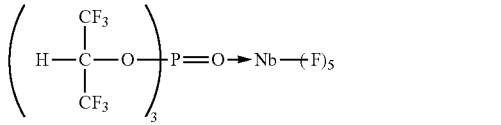

Formula 3

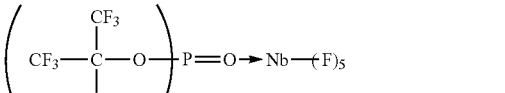

Formula 4

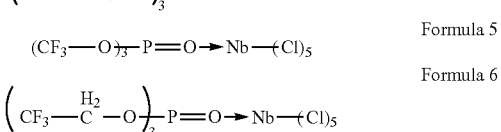

Formula 5

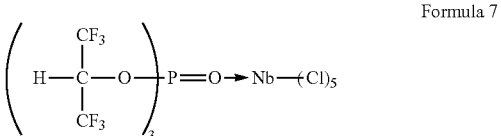

Formula 6

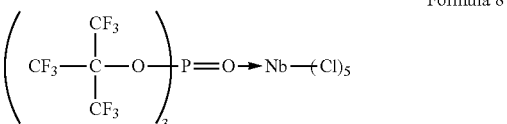

Formula 7

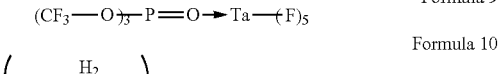

Formula 8

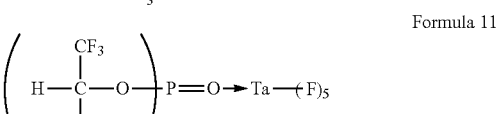

Formula 9

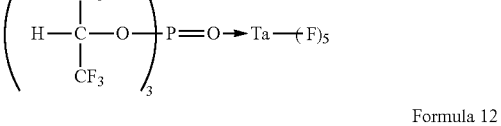

Formula 10

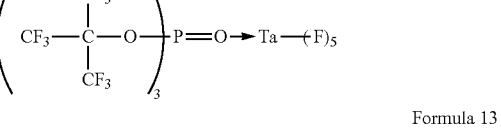

Formula 11

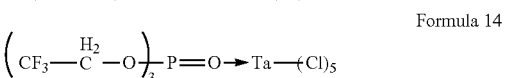

Formula 12

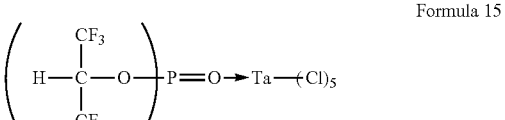

Formula 13

Formula 14

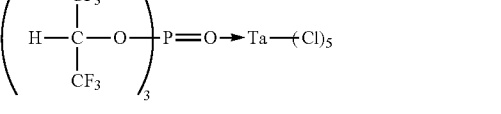

Formula 15

-continued

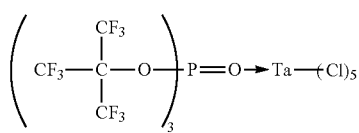

Formula 16

The organometallic adduct compound may be prepared by using suitable reactions. For example, a solvent and unreacted products may be distilled from a solution obtained by causing a reaction of pentachloride niobium with phosphate ester having a structure corresponding to a final structure to be synthesized at a temperature of about 25° C. in a dichloromethane solvent. Thereafter, organometallic adduct compounds according to embodiments may be synthesized by using distillation and purification methods.

The organometallic adduct compound according to the embodiments may be appropriately used as a source for a CVD process or an ALD process.

FIG. 1 is a flowchart of a method of manufacturing an integrated circuit (IC) device, according to embodiments.

Referring to FIG. 1, in process P10, a substrate may be prepared.

The substrate may include silicon, ceramics, glass, a metal, a metal nitride, or a combination thereof. The ceramics may include silicon nitride, titanium nitride, tantalum nitride, titanium oxide, niobium oxide, zirconium oxide, hafnium oxide, lanthanum oxide, or a combination thereof. Each of the metal and the metal nitride may include titanium (Ti), tantalum (Ta), cobalt (Co), ruthenium (Ru), zirconium (Zr), hafnium (Hf), lanthanum (La), or a combination thereof. A surface of the substrate may have a flat, spherical, fibrous, or scalelike shape. In an implementation, the surface of the substrate may have a three-dimensional (3D) structure such as a trench structure or the like.

In an implementation, the substrate may have the same configuration as a substrate 310 that will be described below with reference to FIG. 4A.

In process P20 of FIG. 1, a metal-containing film may be formed on the substrate using a source for forming a metal-containing film. In an implementation, the source may include an organometallic adduct compound represented by General formula (I).

The source for forming the metal-containing film may include an organometallic adduct compound according to an embodiment. In an implementation, the source for forming the metal-containing film may include at least one of the organometallic adduct compounds represented by Formulae 1 to 16. In an implementation, the organometallic adduct compound may be a liquid at room temperature.

The source for forming the metal-containing film may vary, e.g., may be selected in accordance, with a thin film intended to be formed. In an implementation, a metal-containing film intended to be formed may include a niobium-containing film, a tantalum-containing film, or a vanadium-containing film. When a niobium-containing film is to be formed, an organometallic adduct compound of General formula (I), in which M is a niobium atom, may be used as the source for forming the metal-containing film. When a tantalum-containing film is to be formed, an organometallic adduct compound of General formula (I), in which M is a tantalum atom, may be used as the source for forming the metal-containing film. When a vanadium-containing film is to be formed, an organometallic adduct compound of General formula (I), in which M is a vanadium atom, may be used as the source for forming the metal-containing film. In this case, the source for forming the metal-containing film may include only the organometallic adduct compound according to the embodiment and may not include other metal compounds and semimetal compounds.

In an implementation, the metal-containing film intended to be formed may further include another metal in addition to niobium, tantalum, or vanadium. In an implementation, when the metal-containing film to be formed is a film further including another metal or semimetal in addition to niobium, tantalum, or vanadium, the source for forming the metal-containing film may include a compound (referred to as "another precursor" hereinafter) including the desired metal or semimetal, in addition to the organometallic adduct compound according to the embodiment. In an implementation, the source for forming the metal-containing film may include an organic solvent or a nucleophilic reagent in addition to the organometallic adduct compound according to the embodiments.

A CVD process or an ALD process may be used to form the metal-containing film according to process P20 of FIG. 1. The source for forming the metal-containing film, which includes the organometallic adduct compound according to the embodiment, may be suitably used for chemical deposition processes, such as a CVD process or an ALD process.

When the source for forming the metal-containing film is used in the chemical deposition processes, a composition of the source for forming the metal-containing film may be appropriately selected according to a transporting method. A gas transporting method or a liquid transporting method may be used as the transporting method. When the gas transporting method is used, the source for forming the metal-containing film may be vaporized by heating and/or depressurizing in a storage container (hereinafter, referred to as a "source container") in which the source for forming the metal-containing film is stored, to generate vapor. The vapor may be introduced together with a carrier gas (e.g., argon, nitrogen, or helium) used as needed into a chamber (hereinafter, referred to as a "deposition reactor") in which a substrate is loaded. When the liquid transporting method is used, the source for forming the metal-containing film may be transported in a liquid state or a solution state to a vaporizer and heated and/or depressurized and vaporized in the vaporizer to generate vapor, and the vapor may be introduced into the chamber.

When the gas transporting method is used to form the metal-containing film according to process P20 of FIG. 1, the organometallic adduct compound itself represented by General formula (I) may be used as the source for forming the metal-containing film. When the liquid transporting method is used to form the metal-containing film according to process P20 of FIG. 1, the organometallic adduct compound itself represented by General formula (I) or a solution in which the organometallic adduct compound of General formula (I) is dissolved in an organic solvent may be used as the source for forming the metal-containing film. The source for forming the metal-containing film may further include another precursor, a nucleophilic reagent, or the like.

In an implementation, a multi-component CVD process may be used to form a metal-containing film in the method of manufacturing the IC device, according to the embodiment. The multi-component CVD process may be performed by using a method (hereinafter, referred to as a "single source method") of independently vaporizing and supplying respective components of a source for forming a metal-containing film or a method (hereinafter, referred to as a "cocktail source method") of vaporizing and supplying a source mixture obtained by previously mixing multi-component sources in a desired composition. When the cocktail source method is used, a mixture of the organometallic adduct compound according to the embodiment and another precursor or a mixed solution obtained by dissolving the mixture in an organic solvent may be used as the source for forming the metal-containing film. The mixture or the mixed solution may further include a nucleophilic reagent.

The organic solvents may include suitable organic solvents, e.g., acetate esters such as ethyl acetate, n-butyl acetate, and methoxyethyl acetate; ethers such as tetrahydrofuran, tetrahydropyran, ethylene glycol dimethyl ether, diethylene glycol dimethyl ether, triethylene glycol dimethyl ether, and dibutyl ether; ketones such as dibutyl ketone, ethyl butyl ketone, diisobutyl ketone, methyl amyl ketone, cyclohexanone; hydrocarbons such as hexane, cyclohexane, methylcyclohexane, dimethylcyclohexane, ethylcyclohexane, heptane, octane, toluene, and xylene; hydrocarbons having a cyano group such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine; or lutidine. The organic solvents may be used alone or in a mixture of at least two kinds thereof considering the relationships among solubilities, use temperatures, boiling points, and ignition points of solutes.

When the organic solvent is included in the source for forming the metal-containing film, which includes the organometallic adduct compound according to the embodiment, the total amount of the organometallic adduct compound according to the embodiment and the other precursor may range from about 0.01 mol/L to about 2.0 mol/L, e.g., about 0.05 mol/L to about 1.0 mol/L, in the organic solvent. Here, the total amount refers to the amount of the organometallic adduct compound according to the embodiment when the source for forming the metal-containing film does not include a metal compound and a semimetal compound other than the organometallic adduct compound according to the embodiment, and refers to the sum of amounts of the organometallic adduct compound according to the embodiment and another precursor when the source for forming the metal-containing film includes the organometallic adduct compound according to the embodiment and another metal compound or semimetal compound (i.e., the other precursor).

In the method of manufacturing the IC device, according to the embodiment, when the multi-component CVD process is used to form the metal-containing film, the other precursor that may be used together with the organometallic adduct compound according to the embodiment may include a suitable precursor for forming the metal-containing film.

In an implementation, the other precursor that may be used to form a metal-containing film in the method of manufacturing the IC device, according to the embodiment, may include a compound of at least one organic coordination compound of an alcohol compound, a glycol compound, a β-diketone compound, a cyclopentadiene compound, and an organic amine compound, silicon, and a metal.

The other precursor may include, e.g., lithium (Li), sodium (Na), potassium (K), magnesium (Mg), calcium (Ca), strontium (Sr), barium (Ba), titanium (Ti), zirconium (Zr), hafnium (Hf), chromium (Cr), molybdenum (Mo), tungsten (W), manganese (Mn), iron (Fe), cobalt (Co), rhodium (Rh), iridium (Ir), nickel (Ni), platinum (Pt), copper (Cu), silver (Ag), gold (Au), zinc (Zn), aluminum (Al), gallium (Ga), indium (In), germanium (Ge), tin (Sn), lead (Pb), antimony (Sb), bismuth (Bi), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu).

An alcohol compound that may be used as the organic coordination compound of the other precursor may include, e.g., alkyl-alcohols such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether-alcohols such as 2-methoxyethanol, 2-ethoxyethanol, 2-butoxyethanol, 2-(2-methoxyethoxy) ethanol, 2-methoxy-1-methylethanol, 2-methoxy-1, 1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-sec-butoxy-1,1-diethylethanol, and 3-methoxy-1,1-dimethylpropanol; and dialkylaminoalcohols such as dimethyl amino ethanol, ethyl methyl amino ethanol, diethyl amino ethanol, dimethyl amino-2-pentanol, ethyl methyl amino-2-pentanol, dimethyl amino-2-methyl-2-pentanol, ethyl methyl amino-2-methyl-2-pentanol, and diethyl amino-2-methyl-2-pentanol.

A glycol compound that may be used as the organic coordination compound of the other precursor may include, e.g., 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

A β-diketone compound that may be used as the organic coordination compound of the other precursor may include, e.g., alkyl-substituted β-diketones such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3, 5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy) heptane-3,5-dione.

A cyclopentadiene compound that may be used as the organic coordination compound of the other precursor may include, e.g., cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclepentadiene, dimethylcyclopentadiene, and tetramethylcyclopentadiene.

An organic amine compound that may be used as the organic coordination compound of the other precursor may include, e.g., methylamine, ethylamine, propylamine, isopropylamine, butyl amine, sec-butyl amine, tert-butyl amine, isobutyl amine, dimethylamine, diethylamine, dipropylamine, diisopropylamine, ethylmethylamine, propylmethylamine, and isopropylmethylamine.

The other precursor may be a suitable material, and a method of preparing the other precursor may be a suitable method. In an implementation, when an alcohol compound is used as an organic ligand, a precursor may be prepared by causing a reaction of an inorganic salt of the above-described element or a hydrate thereof with an alkali metal alkoxide of the corresponding alcohol compound. In an implementation, the inorganic salt of the above-described element or the hydrate thereof may include, e.g., a metal halide or a metal nitrate. The alkali metal alkoxide may include, e.g., sodium alkoxide, lithium alkoxide, and potassium alkoxide.

When the single source method is used, the other precursor may include a compound that is similar in thermal and/or oxidative decomposition behavior to the organometallic adduct compound according to the embodiment. When the cocktail source method is used, the other precursor may include a material, which is similar in thermal and/or oxidative decomposition behavior to the organometallic adduct compound according to the embodiment, and may not deteriorate due to a chemical reaction when mixed with the organometallic adduct compound according to the embodiment.

In an implementation, to form the metal-containing film using the method of manufacturing the IC device, according to the embodiment, the source for forming the metal-containing film may include a nucleophilic reagent. The nucleophilic reagent may give stability to the organometallic adduct compound including a niobium atom, a tantalum atom, or a vanadium atom, according to the embodiment, and/or the other precursor. The nucleophilic reagent may include, e.g., ethylene glycol ethers such as glyme, diglyme, triglyme, and tetraglyme; crown ethers such as 18-crown-6, dicyclohexyl-18-crown-6, 24-crown-8, dicyclohexyl-24-crown-8, and dibenzo-24-crown-8; polyamines such as ethylene diamine, N,N'-tetramethylethyl diamine, diethylene triamine, triethylene teramine, tetraethylene pentamine, pentaethylene hexamine, 1,1,4,7,7-pentamethyldiethylene triamine, 1,1,4,7,10,10-hexamethyltriethylene tetramine, and triethoxytriethylene amine; cyclic polyamines such as cyclam and cyclen; heterocyclic compounds such as pyridine, pyrrolidine, piperidine, morpholine, N-methyl pyrrolidine, N-methyl piperidine, N-methyl morpholine, tetrahydrofurane, tetrahydropyran, 1,4-dioxane, oxazole, thiazole, and oxathiolane; β-ketone esters such as methyl acetoacetate, ethyl acetoacetate, 2-methoxyethyl acetoacetate; or β-diketones such as acetylacetone, 2,4-hexanedione, 2,4-heptanedione, 3,5-heptanedione, and dipivaloyl methane. The nucleophilic reagent may be used in an amount of about 0.1 mol to about 10 mol, e.g., about 1 mol to about 4 mol, based on 1 mol of the total amount of the precursor.

In the source for forming the metal-containing film, which is used to form the metal-containing film by using the method of manufacturing the IC device, according to the embodiment, it may be helpful to suppress the amounts of an impurity metal element, impurity halogen (e.g., impurity chlorine), and an impurity organic material as much as possible. In an implementation, one type of metal may be included as the impurity metal element in an amount of about 100 ppb or less in the source for forming the metal-containing film. In an implementation, one type of metal may be included as the impurity metal element in the source for forming the metal-containing film in an amount of about 10 ppb or less. In an implementation, the total amount of impurity metals may be included in the source for forming the metal-containing film in an amount of about 1 ppm or less, e.g., about 100 ppb or less. In an implementation, when a metal-containing film used as a gate insulating film, a gate conductive film, or a barrier film, which constitutes a large-scale integration (LSI) device, is formed, it may be helpful to minimize the contents of an alkali metal element and an alkali earth metal element, which affect the electrical characteristics of a resultant thin film. In an implementation, the impurity halogen component may be included in the source for forming the metal-containing film in an amount of about 100 ppm or less, e.g., about 10 ppm or less or about 1 ppm or less.

The impurity organic component may be included in the source for forming the metal-containing film in an amount of about 500 ppm or less, e.g., about 50 ppm or less or about 10 ppm or less, based on the total amount of the source for forming the metal-containing film.

In the source for forming the metal-containing film, moisture may cause particles in the source for forming the metal-containing film or cause particles during a thin-film forming process. In an implementation, the moisture of each of the precursor, the organic solvent, and the nucleophilic reagent may be removed before use thereof. A moisture content of each of the precursor, the organic solvent, and the nucleophilic reagent may be about 10 ppm or less, e.g., about 1 ppm or less.

When the metal-containing film is formed by using the method of manufacturing the IC device, according to the embodiment, content of particles in the source for forming the metal-containing film may be minimized to reduce the contamination of the metal-containing film to be formed with particles. In an implementation, when particles are measured in a liquid state by using a light-scattering-type particle detector, the number of particles having a size of more than about 0.3 μm may be adjusted to 100 or less in 1 ml of a liquid. In an implementation, the number of particles having a size of more than about 0.2 μm may be adjusted to 1,000 or less, in one example, 100 or less, in 1 ml of a liquid.

In process P20 of FIG. 1, the formation of the metal-containing film using the source for forming the metal-containing film may include a process of vaporizing the source for forming the metal-containing film, introducing the source for forming the metal-containing film into the deposition reactor in which the substrate is loaded, and depositing the source for forming the metal-containing film on the surface of the substrate to form a precursor thin film on the substrate and a process of causing a reaction of the precursor thin film with a reactive gas to form the metal-containing film including a niobium atom, a tantalum atom, or a vanadium atom on the surface of the substrate.

To vaporize the source for forming the metal-containing film and introduce the source for forming the metal-containing film into the deposition reactor, the gas transporting method, the liquid transporting method, the single source method, or the cocktail source method, which is described above, or the like may be used.

The reactive gas may be a gas that reacts with the precursor thin film. In an implementation, the reactive gas may include an oxidizing gas, a reducing gas, or a nitriding gas.

The oxidizing gas may include, e.g., $O_2$, $O_3$, $O_2$ plasma, $H_2O$, $NO_2$, NO, $N_2O$, CO, $CO_2$, $H_2O_2$, HCOOH, $CH_3COOH$, $(CH_3CO)_2O$, an alcohol, a peroxides, sulfur oxide, or a combination thereof.

The reducing gas may include, e.g., $H_2$.

The nitriding gas may include, e.g., $NH_3$, $N_2$ plasma, mono-alkyl amine, di-alkylamine, tri-alkylamine, an organic amine compound (e.g., alkylenediamine), a hydrazine compound, or a combination thereof.

When a metal oxide film including a niobium atom, a tantalum atom, or a vanadium atom is formed in process P20 of FIG. 1, the oxidizing gas may be used as the reactive gas.

When a metal nitride film including a niobium atom, a tantalum atom, or a vanadium atom is formed in process P20 of FIG. 1, the nitriding gas may be used as the reactive gas.

In an implementation, in process P20 of FIG. 1, the metal-containing film including the niobium atom, the tantalum atom, or the vanadium atom may be formed by using a thermal CVD process of forming a thin film by reacting a source gas including the organometallic adduct compound according to the embodiment or both the source gas and a reactive gas due to only heat, a plasma CVD process using heat and plasma, a photo-CVD process using heat and light, a photo-plasma CVD process using heat, light, and plasma, or an ALD process.

When the metal-containing film is formed according to process P20 of FIG. 1, a reaction temperature (or a substrate temperature), reaction pressure, a deposition rate, or the like may be appropriately selected according to a desired thickness and type of a desired metal-containing film. The reaction temperature may be a temperature at which the source for forming the metal-containing film may sufficiently react. In an implementation, the reaction temperature may range from room temperature to about 500° C., e.g., about 150° C. to about 400° C.

When the process of forming the metal-containing film according to process P20 of FIG. 1 is performed using an ALD process, a film thickness of the metal-containing film may be controlled by adjusting the number of cycles of the ALD process. The formation of the metal-containing film on the substrate using the ALD process may include a source gas introduction process in which vapor formed by vaporizing a source for forming a metal-containing film, which includes the organometallic adduct compound according to the embodiment, is introduced into the deposition reactor, a precursor thin film forming process in which a precursor thin film is formed on the surface of the substrate by using the vapor, an exhaust process in which unreacted source gases remaining on the substrate are exhausted from a reaction space, and a process in which the precursor thin film is chemically reacted with a reactive gas to form the metal-containing film on the surface of the substrate.

In an implementation, the process of vaporizing the source for forming the metal-containing film may be performed in a source container or a vaporizer. The process of vaporizing the source for forming the metal-containing film may be performed at a temperature of about 0° C. to about 200° C. When the source for forming the metal-containing film is vaporized, inner pressure of the source container or the vaporizer may be in the range of about 1 Pa to about 10,000 Pa.

Figure 2:
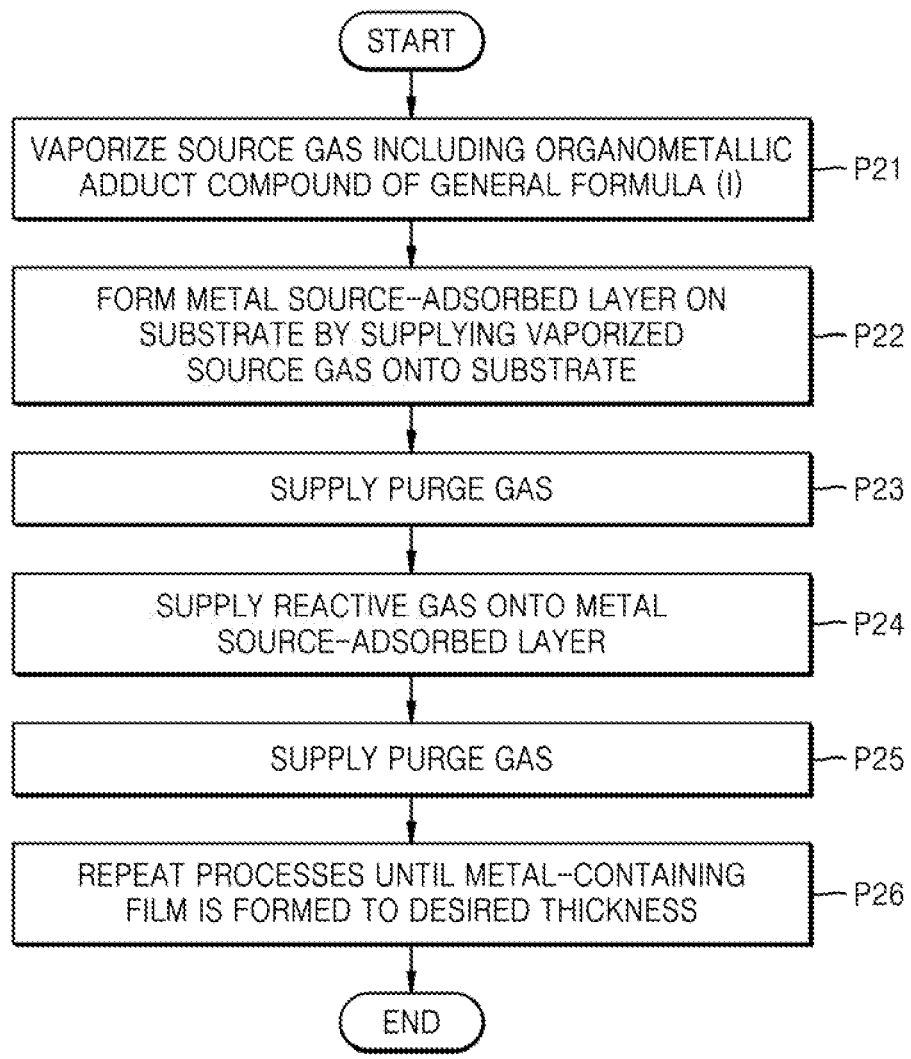
FIG. 2 is a detailed flowchart of a method of forming a metal-containing film by using a method of manufacturing an IC device, according to example embodiments.

FIG. 2 is a detailed flowchart of a method of forming a metal-containing film by using a method of manufacturing an IC device, according to example embodiments. A method of forming the metal-containing film by using an ALD process according to process P20 of FIG. 1 will be described with reference to FIG. 2.

Referring to FIG. 2, in process P21, a source gas including an organometallic adduct compound having a structure of General formula (I) may be vaporized.

In an implementation, the source gas may include a source for forming the metal-containing film, which is described above. The process of vaporizing the source gas may be performed at a temperature of about 0° C. to about 200° C. When the source gas is vaporized, inner pressure of a source container or a vaporizer may range from about 1 Pa to about 10,000 Pa.

In process P22, the source gas vaporized according to process P21 may be supplied onto a substrate, and thus, a metal source-adsorbed layer including a niobium atom, a tantalum atom, or a vanadium atom may be formed on the substrate. In this case, a reaction temperature may range from room temperature to about 500° C., e.g., about 150° C. to about 400° C. A reaction pressure may be in the range of about 1 Pa to about 10,000 Pa, e.g., about 10 Pa to about 1,000 Pa.

By supplying the vaporized source gas onto the substrate, an adsorbed layer including a chemisorbed layer and a physisorbed layer of the vaporized source gas may be formed on the substrate.

In process P23, unnecessary by-products remaining on the substrate may be removed by supplying a purge gas onto the substrate.

In an implementation, an inert gas, such as argon (Ar), helium (He), or neon (Ne), or nitrogen ($N_2$) gas may be used as the purge gas.

In an implementation, instead of the purge gas, a reaction space in which the substrate is loaded may be exhausted by reducing pressure of the reaction space. In this case, to reduce the pressure of the reaction chamber, the reaction space may be maintained under pressure of about 0.01 Pa to about 300 Pa, e.g., about 0.01 Pa to about 100 Pa.

In an implementation, a process of heating the substrate on which the metal source-adsorbed layer including the niobium atom, the tantalum atom, or the vanadium atom is formed or a process of annealing a reaction chamber containing the substrate may be further performed. The annealing process may be performed at room temperature to a temperature of about 500° C., e.g., at a temperature of about 50° C. to about 400° C.

In process P24, a reactive gas may be supplied onto the metal source-adsorbed layer formed on the substrate, and thus, a metal-containing film may be formed on an atomic level.

In an implementation, when a metal oxide film including a niobium atom, a tantalum atom, or a vanadium atom is formed on the substrate, the reactive gas may be an oxidizing gas, e.g., $O_2$, $O_3$, $O_2$ plasma, $H_2O$, $NO_2$, NO, $N_2O$, CO, $CO_2$, $H_2O_2$, HCOOH, $CH_3COOH$, $(CH_3CO)_2O$, an alcohol, a peroxide, sulfur oxide, or a combination thereof.

In an implementation, when a metal nitride film including a niobium atom, a tantalum atom, or a vanadium atom is formed on the substrate, the reactive gas may include, e.g., $NH_3$, $N_2$ plasma, mono-alkyl amine, di-alkylamine, tri-alkylamine, an organic amine compound, a hydrazine compound, and a combination thereof.

In an implementation, the reactive gas may be a reducing gas, e.g., $H_2$.

In process P24, the reaction space may be maintained at room temperature to a temperature of about 500° C., e.g., at a temperature of about 50° C. to about 400° C. or at a temperature of about 50° C. to about 200° C. such that the metal source-adsorbed layer including the niobium atom, the tantalum atom, or the vanadium atom may sufficiently react with the reactive gas. In process P24, pressure of the reaction space may range from about 1 Pa to about 10,000 Pa, e.g., about 10 Pa to about 1,000 Pa.

In process P24, the reactive gas may be processed with plasma. During the plasma processing process, a radio-frequency (RF) output may range from about 0 W to about 1,500 W, e.g., about 50 W to about 600 W.

In process P25, unnecessary by-products remaining on the substrate may be removed by supplying a purge gas onto the substrate.

In an implementation, an inert gas, such as argon (Ar), helium (He), or neon (Ne), or nitrogen ($N_2$) gas may be used as a purge gas.

In process P26, processes P21 to P25 of FIG. 2 may be repeated until the metal-containing film is formed to a desired thickness.

A thin-film deposition process including a series of processes, e.g., processes P21 to P25, may be defined as one cycle, and the cycle may be repeated a plurality of times until the metal-containing film is formed to a desired thickness. In an implementation, after the cycle is performed once, unreacted gases may be exhausted from the reaction chamber by performing an exhaust process using a purge gas, which is similar to that of process P23 or P25, and subsequent cycles may be then performed.

In an implementation, conditions (e.g., vaporization temperatures or vaporization pressures of sources) for supplying sources, a reaction temperature, and a reaction pressure may be adjusted to control a deposition rate of the metal-containing film. If the deposition rate of the metal-containing film were to be excessively high, characteristics of the obtained metal-containing film could be degraded. If the deposition rate of the metal-containing film were to be excessively low, productivity could be reduced. In an implementation, the deposition rate of the metal-containing film may be in the range of about 0.01 nm/min to about 100 nm/min, e.g., about 1 nm/min to about 50 nm/min.

The method of forming the metal-containing film, which has been described with reference to FIG. 2, is an example, and various modifications and changes of the method may be made.

In an implementation, to form the metal-containing film on the substrate, the organometallic adduct compound represented by General formula (I) and at least one of another precursor, a reactive gas, a carrier gas, and a purge gas may be simultaneously or sequentially supplied onto the substrate. Details of the other precursor, the reactive gas, the carrier gas, and the purge gas, which may be supplied onto the substrate together with the organometallic adduct compound represented by General formula (I), are as described above.

In an implementation, in the process of forming the metal-containing film, which has been described with reference to FIG. 2, the reactive gas may be supplied onto the substrate between processes P21 to P25.

FIGS. 3A to 3D are schematic diagrams of configurations of deposition systems 200A, 200B, 200C, and 200D, which may be used to form a metal-containing film in a method of manufacturing an IC device, according to example embodiments.

Each of the deposition systems 200A, 200B, 200C, and 200D shown in FIGS. 3A to 3D may include a fluid transmission unit 210, a thin-film formation unit 250 configured to perform a deposition process of forming a thin film on a substrate W by using a process gas supplied from a source container 212 included in the fluid transmission unit 210, and an exhaust system 270 configured to exhaust gases or by-products, which may remain after a reaction occurs in the thin-film formation unit 250.

The thin-film formation unit 250 may include a reaction chamber 254 including a susceptor 252 configured to support the substrate W. A shower head 256 may be installed at a top end unit of the inside of the reaction chamber 254. The shower head 256 may be configured to supply gas supplied from the fluid transmission unit 210 onto the substrate W.

The fluid transmission unit 210 may include an inlet line 222 configured to supply a carrier gas from the outside to the source container 212 and an outlet line 224 configured to supply a source compound contained in the source container 212 to the thin-film formation unit 250. A valve V1 and a mass flow controller (MFC) M1 may be installed at the inlet line 222, and a valve V2 and an MFC M2 may be installed at the outlet line 224. The inlet line 222 and the outlet line 224 may be connected to each other through a bypass line 226. A valve V3 may be installed at the bypass line 226. The valve V3 may operate due to pneumatic pressure by using an electric motor or another remote control unit.

The source compound supplied from the source container 212 may be supplied into the reaction chamber 254 through an inlet line 266 of the thin-film formation unit 250, which is connected to the outlet line 224 of the fluid transmission unit 210. When necessary, the source compound supplied from the source container 212 may be supplied into the reaction chamber 254 together with a carrier gas supplied through an inlet line 268. A valve V4 and an MFC M3 may be installed at the inlet line 268 into which the carrier gas is supplied.

The thin-film formation unit 250 may include an inlet line 262 configured to supply a purge gas into the reaction chamber 254 and an inlet line 264 configured to supply a reactive gas. A valve V5 and an MFC M4 may be installed at the inlet line 262, and a valve V6 and an MFC M5 may be installed at the inlet line 264.

The process gas used in the reaction chamber 254 and reaction by-products to be discarded may be exhausted to the outside through an exhaust system 270. The exhaust system 270 may include an exhaust line 272 connected to the reaction chamber 254 and a vacuum pump 274 installed at the exhaust line 272. The vacuum pump 274 may eliminate the process gas and the reaction by-products, which are exhausted from the reaction chamber 254.

A trap 276 may be installed in the exhaust line 272 at an upstream side of the vacuum pump 274. The trap 276 may trap, e.g., reaction by-products, which are generated by unreacted process gases in the reaction chamber 254, and prevent the reaction by-products from flowing into the vacuum pump 274 disposed at a downstream side.

The trap 276 installed at the exhaust line 272 may trap e.g., reaction by-products, which may occur due to a reaction between the process gases, and may prevent the reaction by-products from flowing to a downstream side of the trap 276. The trap 276 may be configured to be cooled by a cooler or a water cooling device.

In addition, a bypass line 278 and an automatic pressure controller (APC) 280 may be installed in the exhaust line 272 at an upstream side of the trap 276. A valve V7 may be installed at the bypass line 278, and a valve V8 may be installed at a portion of the exhaust line 272, which may extend parallel to the bypass line 278.

Figure 3A:
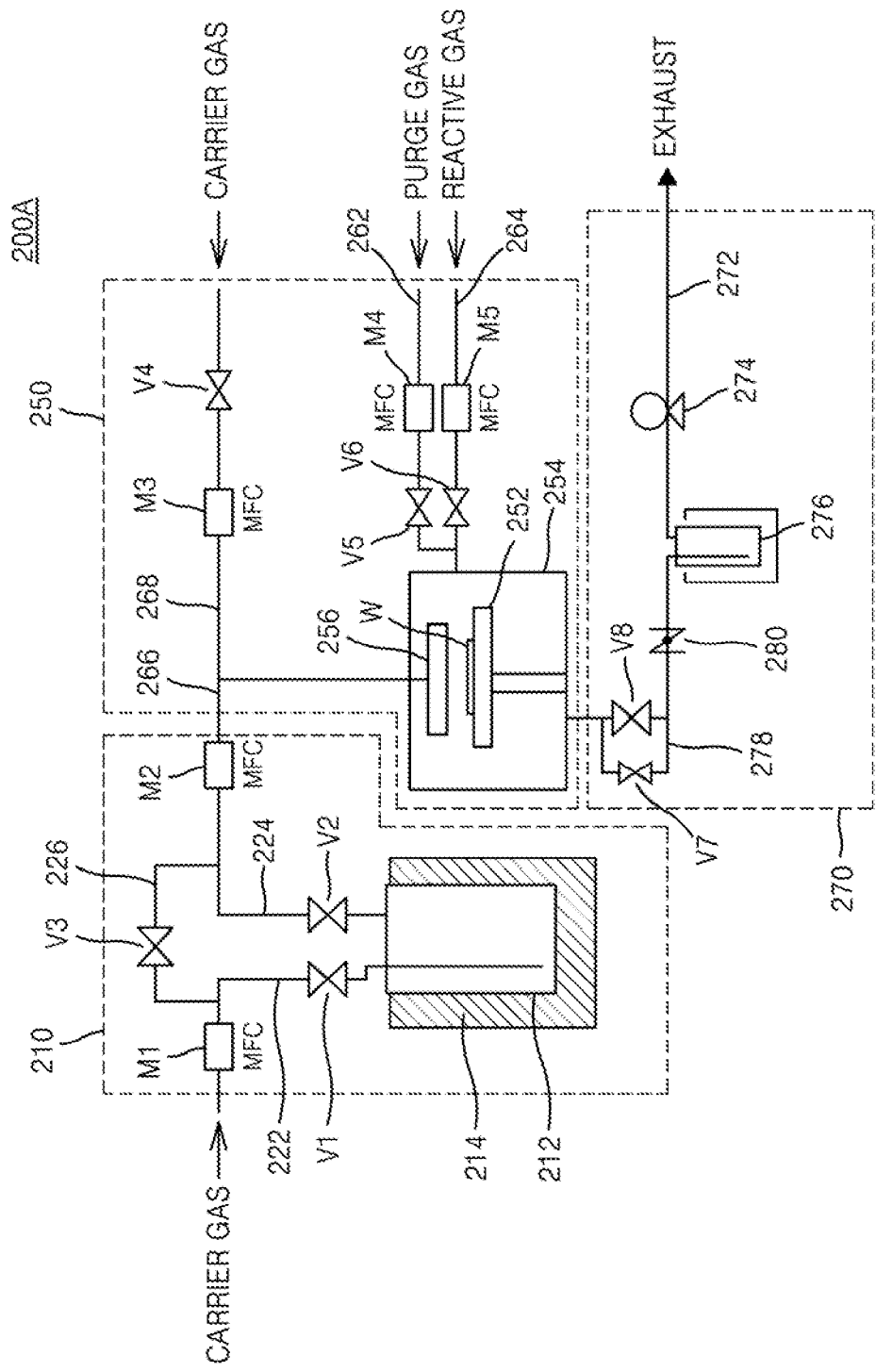
FIGS. 3A to 3D are schematic diagrams of configurations of deposition systems, which may be used to form a metal-containing film in a method of manufacturing an IC device, according to example embodiments.
Figure 3B:
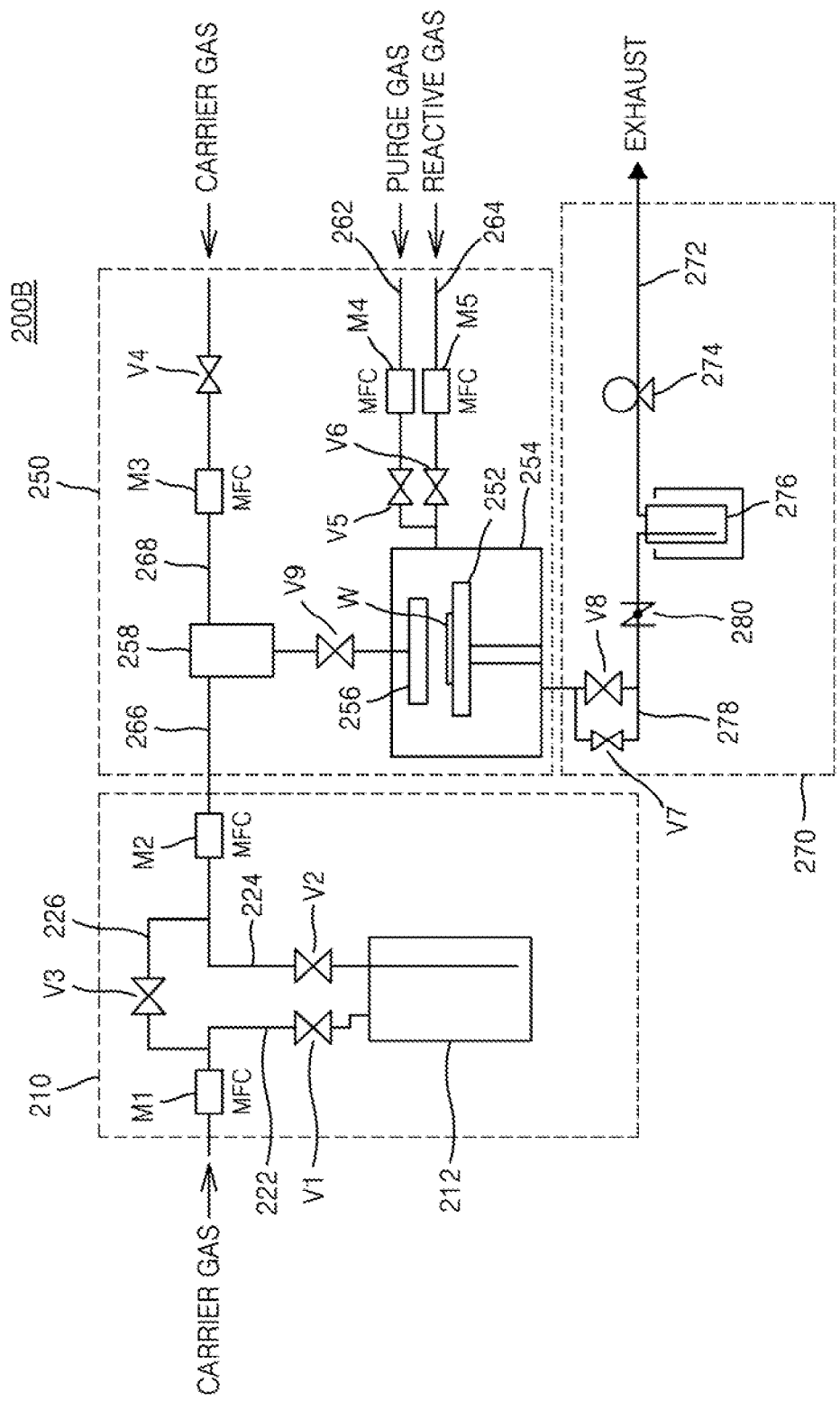
Figure 3C:
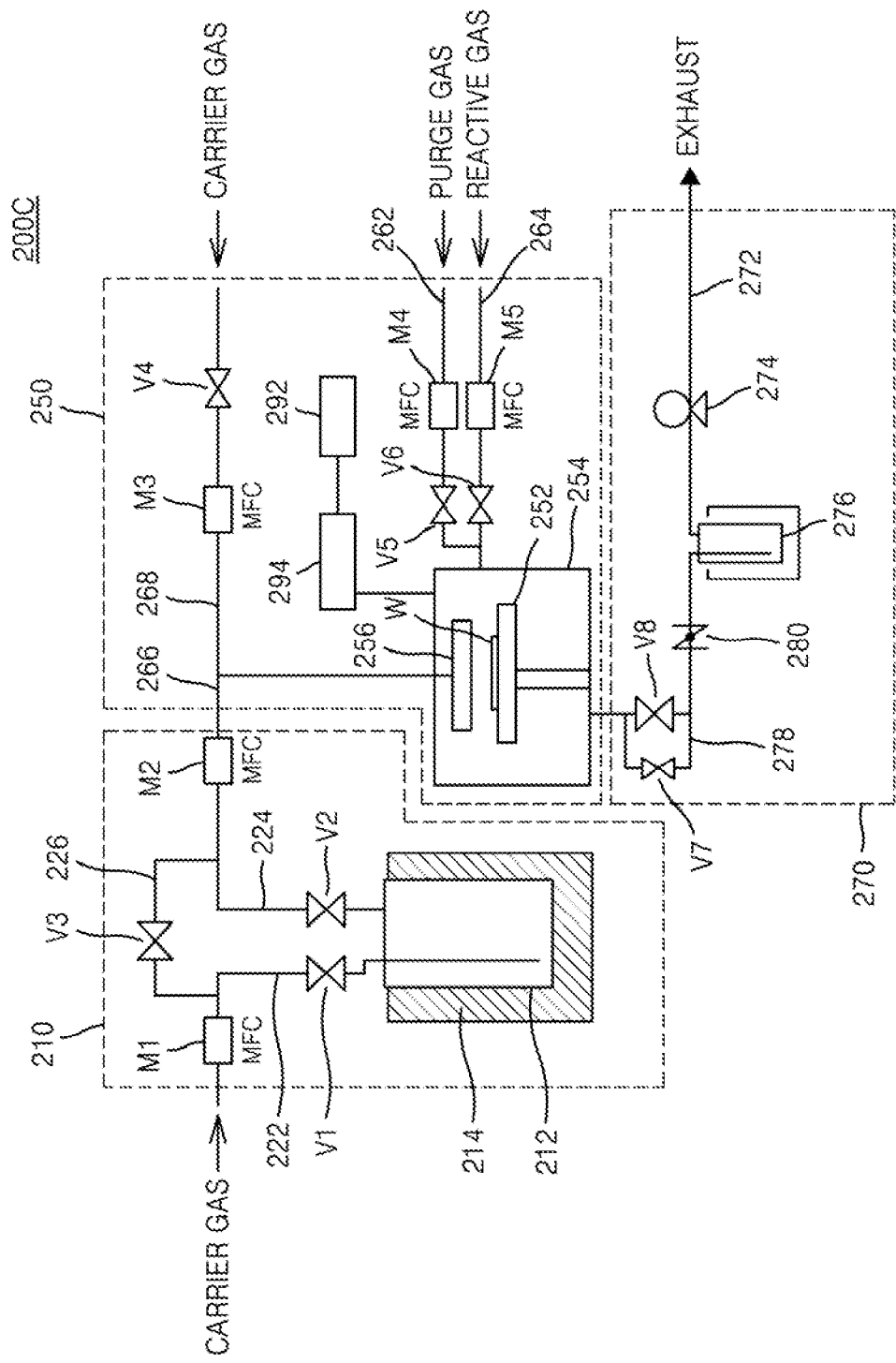

As in the deposition systems 200A and 200C shown in FIGS. 3A and 3C, a heater 214 may be installed in the source container 212. A source compound contained in the source container 212 may be maintained at a relatively high temperature by the heater 214.

Figure 3D:
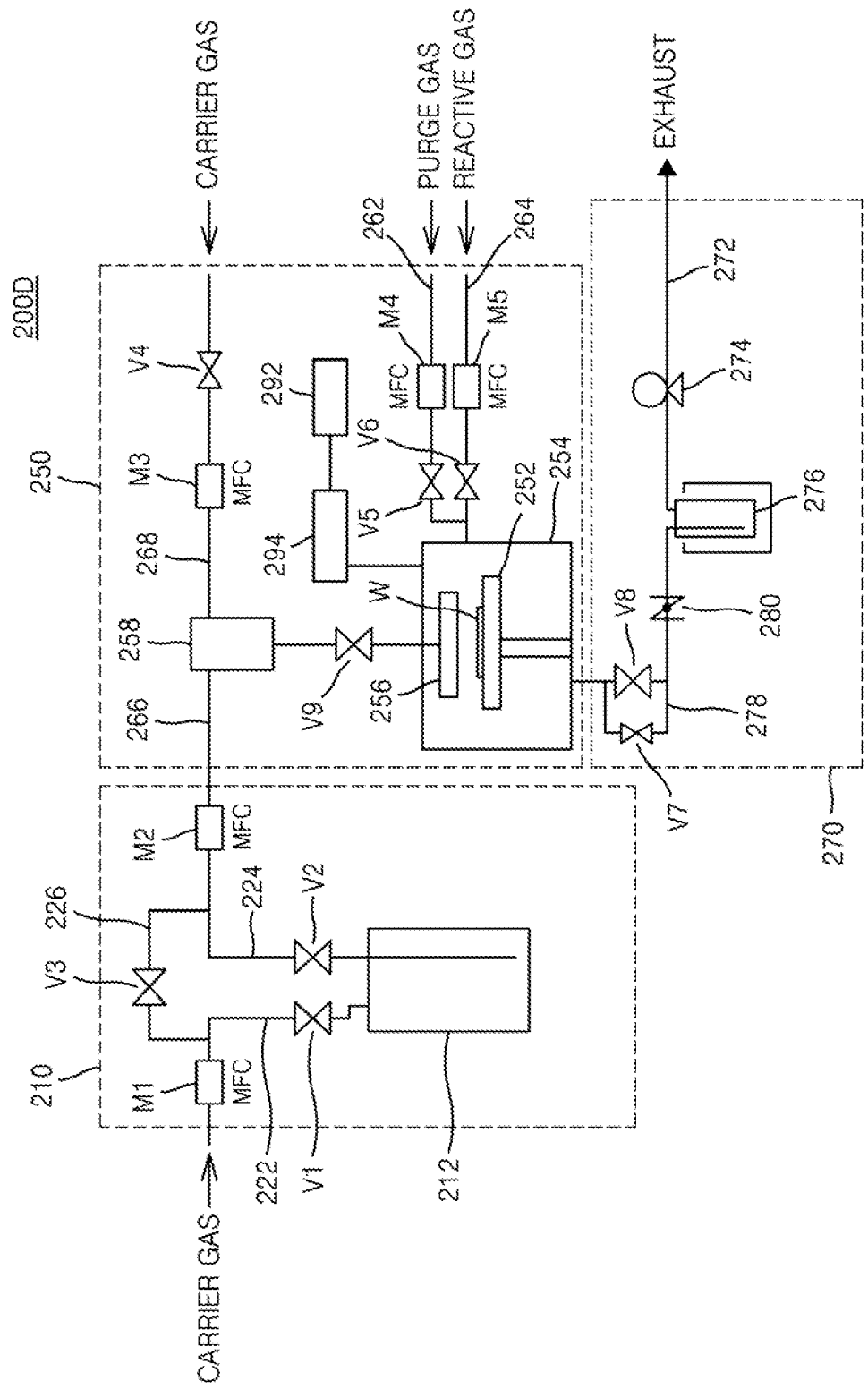

As in the deposition systems 200B and 200D shown in FIGS. 3B and 3D, a vaporizer 258 may be installed at the inlet line 266 of the thin-film formation unit 250. The vaporizer 258 may vaporize a fluid supplied in a liquid state from the fluid transmission unit 210 and supply the vaporized source compound into the reaction chamber 254. The source compound vaporized by the vaporizer 258 may be supplied into the reaction chamber 254 together with a carrier gas supplied through the inlet line 268. The supplying of the source compound into the reaction chamber 254 through the vaporizer 258 may be controlled by a valve V9.

In an implementation, as in the deposition systems 200C and 200D shown in FIGS. 3C and 3D, to generate plasma in the reaction chamber 254, the thin-film formation unit 250 may include a radio-frequency (RF) power source 292 and an RF matching system 294, which are connected to the reaction chamber 254.

In an implementation, as illustrated in FIGS. 3A to 3D, the deposition systems 200A, 200B, 200C, and 200D may be configured such that one source container 212 is connected to the reaction chamber 254. In an implementation, a plurality of source containers 212 may be provided in the fluid transmission unit 210, and each of the plurality of source containers 212 may be connected to the reaction chamber 254. The number of source containers 212 connected to the reaction chamber 254 may be a suitable number.

In an implementation, the source for forming the metal-containing film, which includes an organometallic adduct compound of General formula (I), may be vaporized by using the vaporizer 258 in any one of the deposition systems 200B and 200D shown in FIGS. 3B and 3D.

In the method of manufacturing the IC device, which has been described with reference to FIGS. 1 and 2, any one of the deposition systems 200A, 200B, 200C, and 200D shown in FIGS. 3A to 3D may be used to form the metal-containing film on the substrate W. To form the metal-containing film on the substrate W, the organometallic adduct compound of General formula (I), according to the embodiment, may be transported by using various methods and supplied into a reaction space of a thin-film forming system, e.g., the reaction chamber 254 of each of the deposition systems 200A, 200B, 200C, and 200D shown in FIGS. 3A to 3D.

In an implementation, to form the metal-containing film according to the method described with reference to FIGS. 1 and 2, the metal-containing film may be simultaneously formed on a plurality of substrates by using a batch-type apparatus instead of a single-type apparatus, such as the deposition systems 200A, 200B, 200C, and 200D shown in FIGS. 3A to 3D.

When the metal-containing film is formed by using the method of manufacturing the IC device, according to the embodiment, conditions for forming the metal-containing film may include a reaction temperature (or substrate temperature), reaction pressure, and a deposition speed.

The reaction temperature may be a temperature at which an organometallic adduct compound according to an embodiment, e.g., the organometallic adduct compound of General formula (I), may sufficiently react. In an implementation, the reaction temperature may be a temperature of about 150° C. or higher. In an implementation, the reaction temperature may be selected in the range of about 150° C. to about 400° C. or in the range of about 200° C. to about 350° C.

In an implementation, the reaction pressure may be selected in the range of about 10 Pa to pressure of atmospheric pressure in the case of a thermal CVD process or a photo-CVD process, and selected in the range of about 10 Pa to about 2,000 Pa in the case of a plasma CVD process.

A deposition speed may be controlled by adjusting conditions (e.g., a vaporization temperature and vaporization pressure) for supplying a source compound, a reaction temperature, and a reaction pressure. In an implementation, in the method of manufacturing the IC device, according to the embodiment, a deposition speed of the metal-containing film may be selected in the range of about 0.01 nm/min to about 100 nm/min, e.g., in the range of about 1 nm/min to about 50 nm/min. When the metal-containing film is formed by using an ALD process, the number of cycles of the ALD process may be adjusted to control a thickness of the metal-containing film.

In an implementation, when a metal-containing film is formed using an ALD process, energy (e.g., plasma, light, or a voltage) may be applied. A time period for which the energy is applied may be variously selected. In an implementation, the energy (e.g., plasma, light, or a voltage) may be applied when a source gas including the organometallic adduct compound is introduced into a reaction chamber, when the source gas is adsorbed on the substrate W, when an exhaust process is performed using the purge gas, when the reactive gas is introduced into the reaction chamber, or between respective time periods for which the processes described above are performed.

In an implementation, after the metal-containing film is formed using the organometallic adduct compound of General formula (I), a process of annealing the metal-containing film under an inert atmosphere, an oxidizing atmosphere, or a reducing atmosphere may be further performed. In an implementation, to remove a roughness from the surface of the metal-containing film, a reflow process may be performed on the metal-containing film. Each of the annealing process and the reflow process may be performed under temperature conditions of about 200° C. to about 1,000° C., e.g., about 250° C. to about 500° C.

In an implementation, various types of metal-containing films may be formed by appropriately selecting the organometallic adduct compound according to the embodiment, the other precursor, which may be used together with the organometallic adduct compound, the reactive gas, and conditions for forming thin films. In an implementation, the metal-containing film formed using the method according to the embodiment may include a niobium atom, a tantalum atom, or a vanadium atom. In an implementation, the metal-containing film may include a niobium film, a niobium oxide film, a niobium nitride film, a niobium alloy film, a niobium-containing composite oxide film, a tantalum film, a tantalum oxide film, a tantalum nitride film, a tantalum alloy film, or a tantalum-containing composite oxide film. The niobium alloy film may include, e.g., a Nb—Hf alloy or a Nb—Ti alloy. The tantalum alloy film may include, e.g., a Ta—Ti alloy or a Ta—W alloy. The metal-containing film formed using the method according to the embodiment may be used as a material for various components included in an IC device. In an implementation, the metal-containing film may be used for an electrode material for a dynamic random access memory (DRAM) device, a gate of a transistor, a resistor, an anti-magnetic film used for a hard device recording layer, a catalyst material for a solid polymer fuel cell, a conductive barrier film used for a metal wire, a dielectric film of a capacitor, a barrier metal film for liquid crystals, a member for thin-film solar cells, a member for semiconductor equipment, a nano-structure, or the like.

FIGS. 4A to 4J are cross-sectional views of stages in a method of manufacturing an IC device (refer to 300 in FIG. 4J) according to embodiments.

Figure 4A:
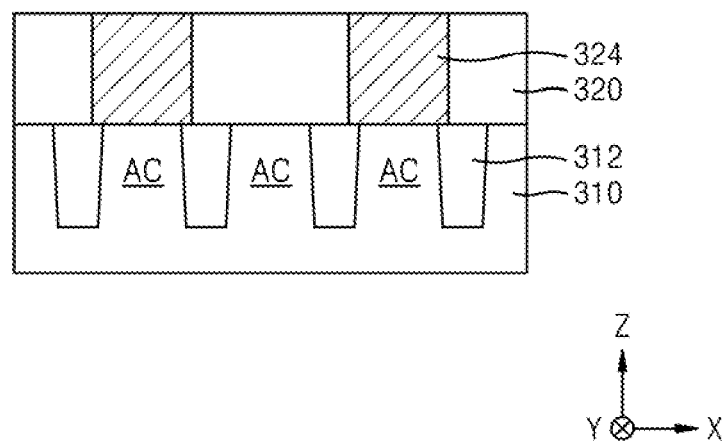
FIGS. 4A to 4J are cross-sectional views of stages in a method of manufacturing an IC device, according to embodiments.

Referring to FIG. 4A, an interlayer dielectric 320 may be formed on a substrate 310 including a plurality of active regions AC. Thereafter, a plurality of conductive regions 324 may be formed to pass through the interlayer dielectric 320 and be connected to a plurality of active regions AC.

The substrate 310 may include a semiconductor, such as silicon (Si) or germanium (Ge), or a compound semiconductor, such as silicon germanium (SiGe), silicon carbide (SiC), gallium arsenide (GaAs), indium arsenide (InAs), or indium phosphide (InP). The substrate 310 may include a conductive region, e.g., a doped well or a doped structure. The plurality of active regions AC may be defined by a plurality of device isolation regions 312 formed in the substrate 310. The device isolation regions 312 may include a silicon oxide film, a silicon nitride film, a silicon oxynitride film, or a combination thereof. The interlayer dielectric 320 may include a silicon oxide film. The plurality of conductive regions 324 may be connected to one terminal of a switching device (e.g., a field-effect transistor) formed on the substrate 310. The plurality of conductive regions 324 may include polysilicon, a metal, a conductive metal nitride, a metal silicide, or a combination thereof.

Figure 4B:
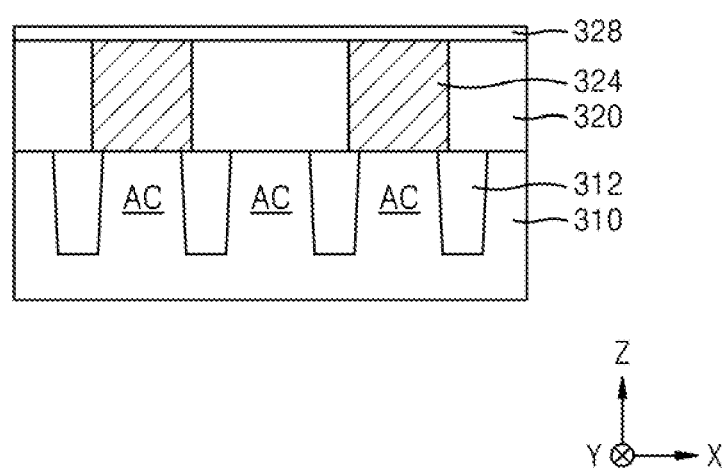

Referring to FIG. 4B, an insulating layer 328 covering the interlayer dielectric 320 and the plurality of conductive regions 324 may be formed. The insulating layer 328 may be used as an etch stop layer. The insulating layer 328 may include an insulating material having an etch selectivity with respect to the interlayer dielectric 320 and a mold film 330 (see FIG. 4C) which is formed in a subsequent process. The insulating layer 328 may include silicon nitride, silicon oxynitride, or a combination thereof.

Figure 4C:
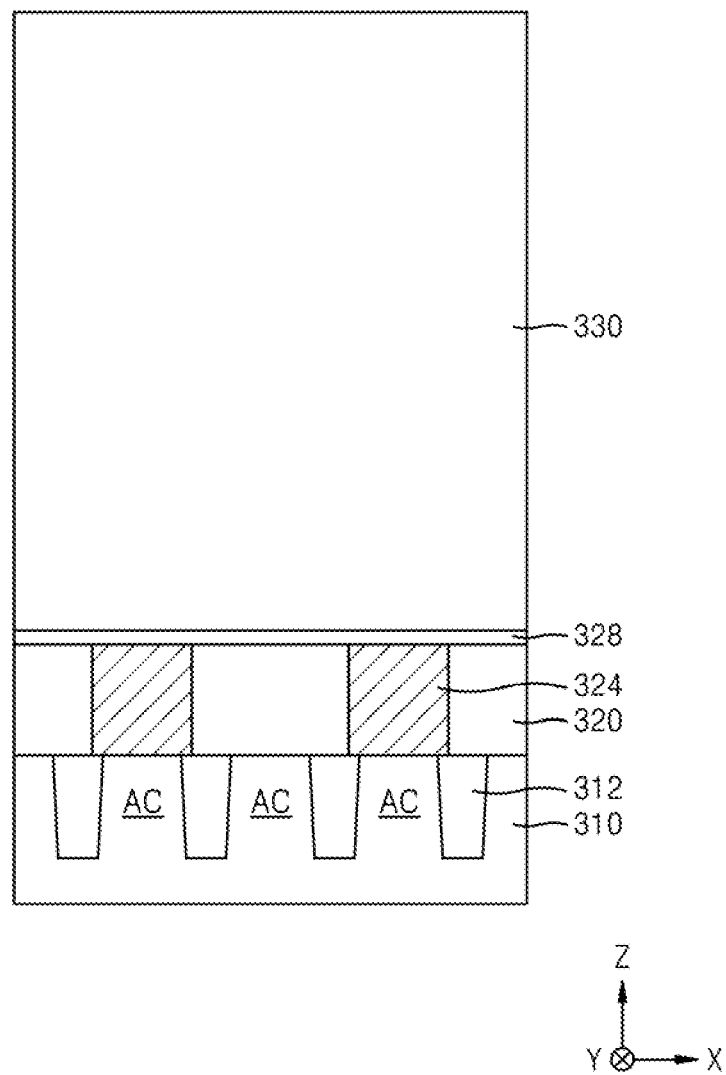

Referring to FIG. 4C, a mold film 330 may be formed on the insulating layer 328.

The mold film 330 may include an oxide film. In an implementation, the mold film 330 may include an oxide film, e.g., borophosphosilicate glass (BPSG), phosphosilicate glass (PSG), or undoped silicate glass (USG). To form the mold film 130, a thermal CVD process or a plasma CVD process may be used. The mold film 330 may have a thickness of, e.g., about 1,000 Å to about 20,000 Å. In an implementation, the mold film 330 may include a support film. The support film may include a material having an etch selectivity with respect to the mold film 330. The support film may include a material having a relatively low etch rate with respect to an etch atmosphere, e.g., with respect to an etchant including ammonium fluoride ($NH_4F$), hydrofluoric acid (HF), and water when the mold film 330 is removed in a subsequent process. In an implementation, the support film may include silicon nitride, silicon carbonitride, tantalum oxide, titanium oxide, or a combination thereof.

Figure 4D:
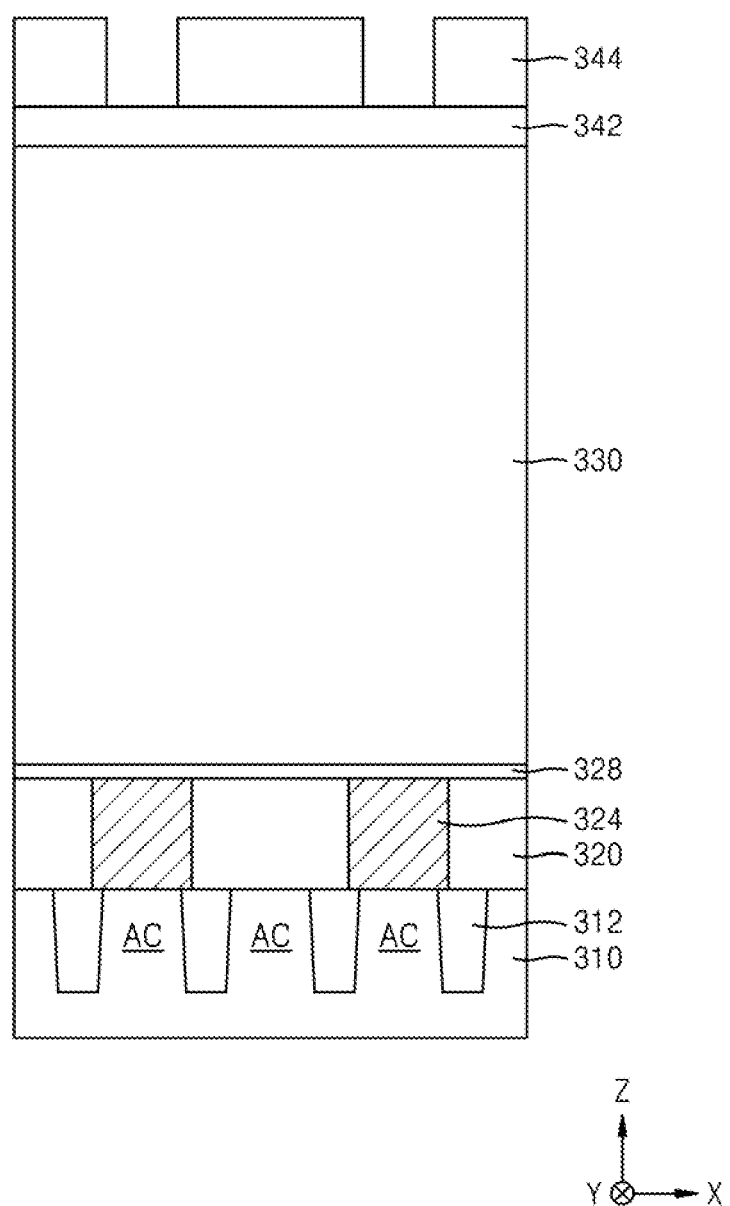

Referring to FIG. 4D, a sacrificial film 342 and a mask pattern 344 may be sequentially formed on the mold film 330.

The sacrificial film 342 may include an oxide film. The mask pattern 344 may include an oxide film, a nitride film, a polysilicon film, a photoresist film, or a combination thereof. A region in which a lower electrode of a capacitor will be formed may be defined by the mask pattern 344.

Figure 4E:
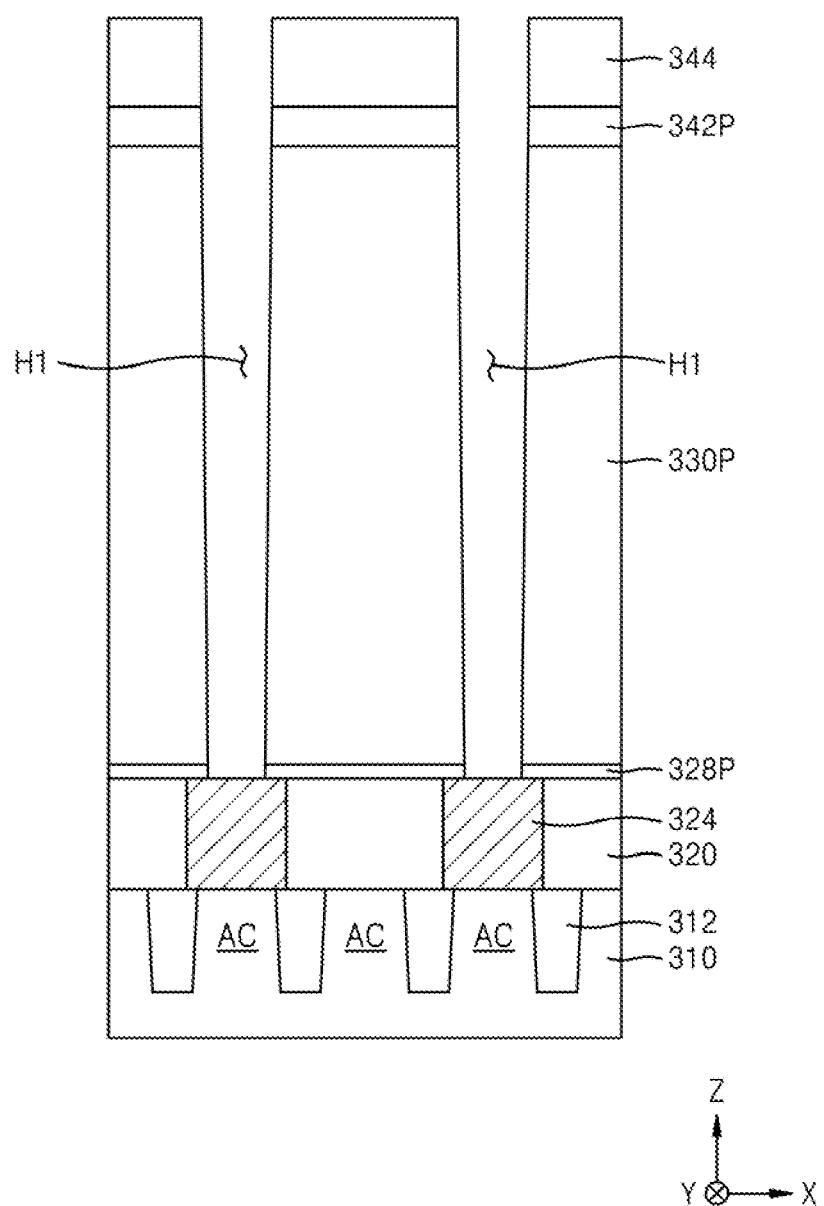

Referring to FIG. 4E, the sacrificial film 342 and the mold film 330 may be dry-etched using the mask pattern 344 as an etch mask and using the insulating layer 328 as an etch stop layer, thereby forming a sacrificial pattern 342P and a mold pattern 330P, which define a plurality of holes H1. In an implementation, the insulating layer 328 may also be etched due to over-etch, whereby an insulating pattern 328P exposing the plurality of conductive regions 324 may be formed.

Figure 4F:
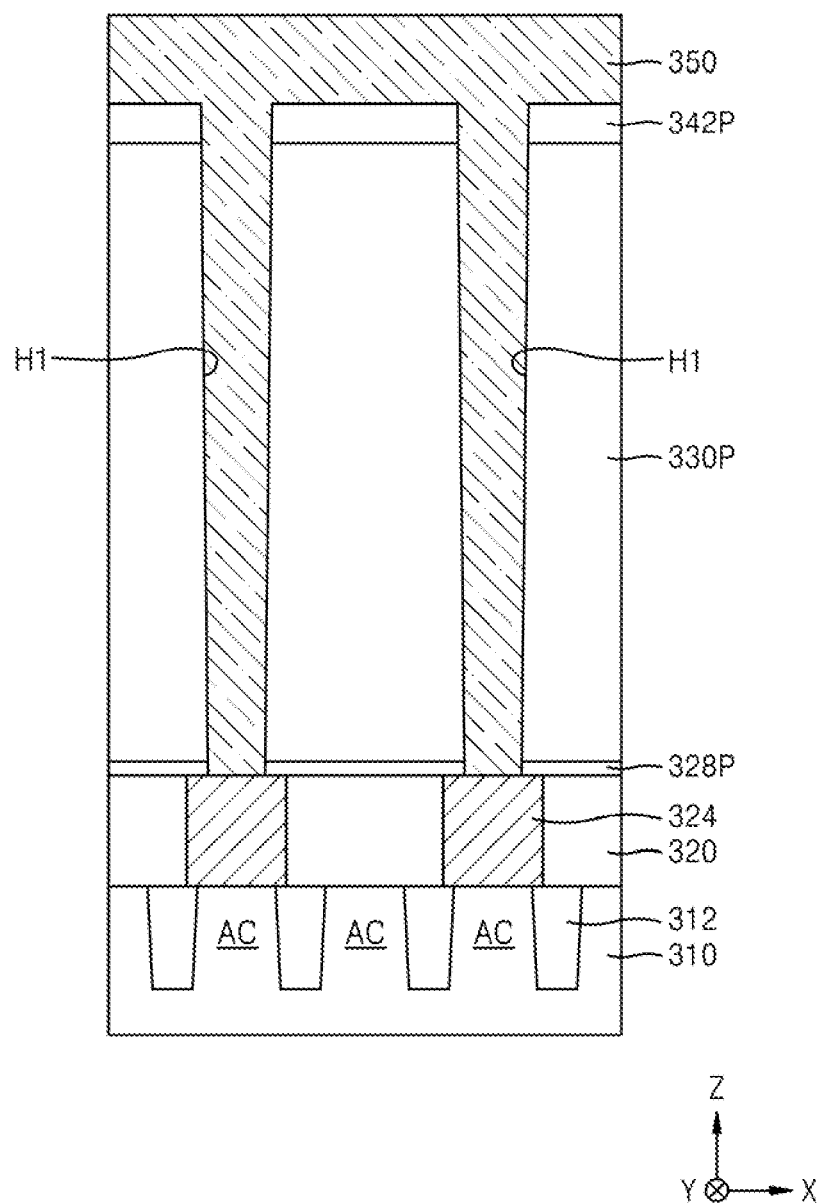

Referring to FIG. 4F, the mask pattern 344 may be removed from the resultant of FIG. 4E, followed by forming a conductive film 350 for forming lower electrodes, which fills the plurality of holes H1 and covers an exposed surface of the sacrificial pattern 342P.

The conductive film 350 for forming lower electrodes may include a doped semiconductor, a conductive metal nitride, a metal, a metal silicide, a conductive oxide, or a combination thereof. In an implementation, the conductive film 350 for forming lower electrodes may include, e.g., NbN, TiN, TiAlN, TaN, TaAlN, W, WN, Ru, $RuO_2$, $SrRuO_3$, Ir, $IrO_2$, Pt, PtO, SRO($SrRuO_3$), BSRO(($Ba,Sr$)$RuO_3$), CRO ($CaRuO_3$), LSCo(($La,Sr$)$CoO_3$), or a combination thereof. To form the conductive film 350 for forming lower electrodes, a CVD, metal organic CVD (MOCVD), or ALD process may be used.

In an implementation, to form the conductive film 350 for forming the lower electrodes, a metal-containing film may be formed using process P20 of FIG. 1 or the method described with reference to FIG. 2. In an implementation, the conductive film 350 for forming the lower electrodes may include a multilayered structure including a TiN film and a NbN film. The NbN film may be a film formed using process P20 of FIG. 1 or the method described with reference to FIG. 2. Any one of the deposition systems 200A, 200B, and 200C, and 200D shown in FIGS. 3A to 3D may be used to form the conductive film 350 for forming the lower electrodes.

Figure 4G:
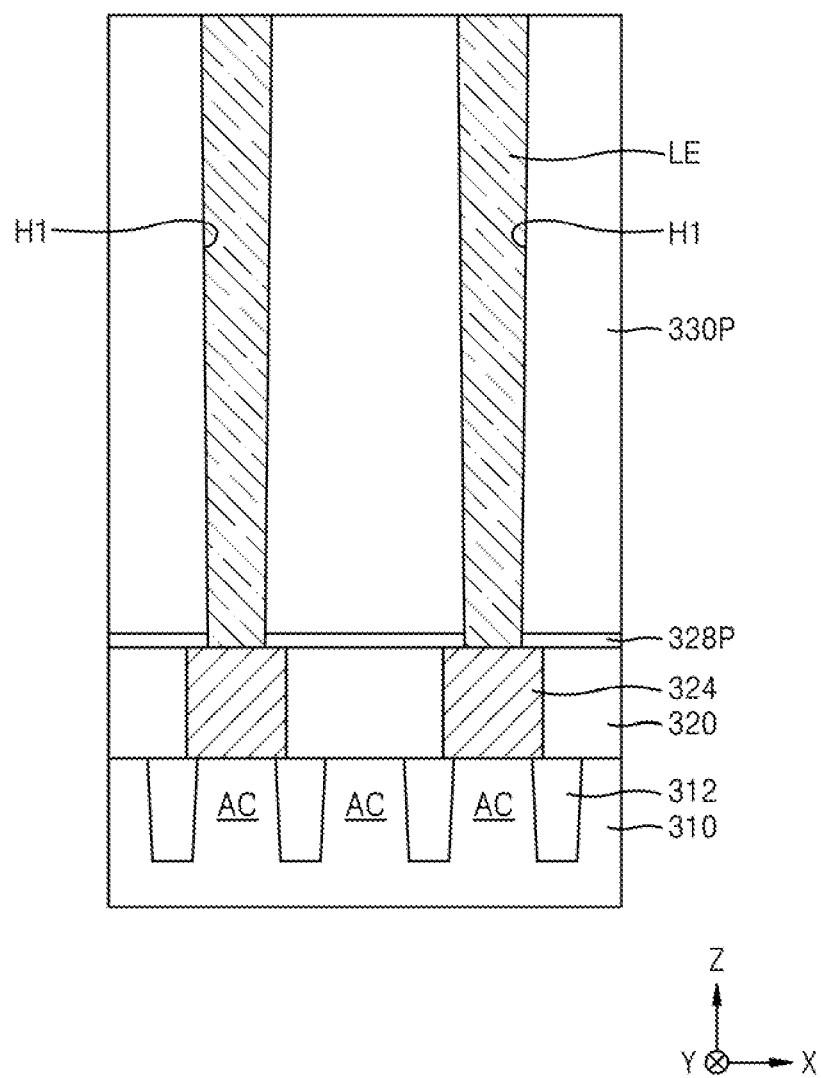

Referring to FIG. 4G, an upper side of the conductive film 350 for forming lower electrodes may be partially removed, thereby dividing the conductive film 350 for forming lower electrodes into a plurality of lower electrodes LE.

To form the plurality of lower electrodes LE, a portion of the upper side of the conductive film 350 for forming lower electrodes and the sacrificial pattern 342P (see FIG. 4F) may be removed by using an etchback or chemical mechanical polishing (CMP) process so that an upper surface of the mold pattern 330P is exposed.

Figure 4H:
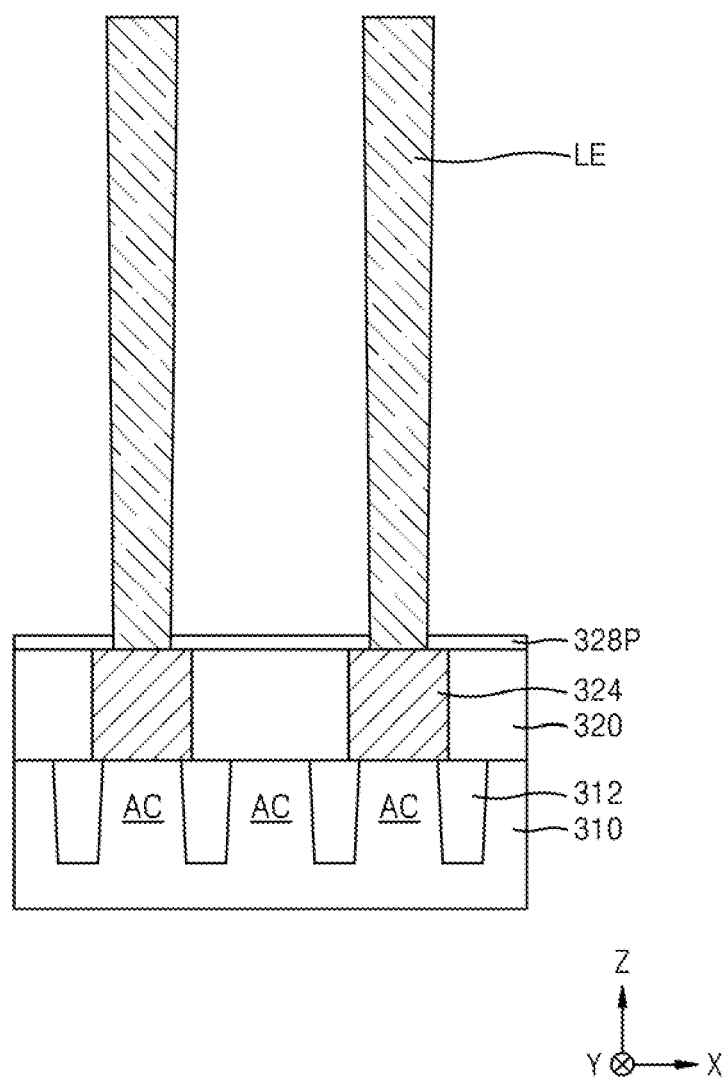

Referring to FIG. 4H, outer surfaces of the plurality of lower electrodes LE may be exposed by removing the mold pattern 330P from the resultant of FIG. 4G. The mold pattern 330P may be removed by a lift-off process using an etchant including ammonium fluoride ($NH_4F$), hydrofluoric acid (HF), and water.

Figure 4I:
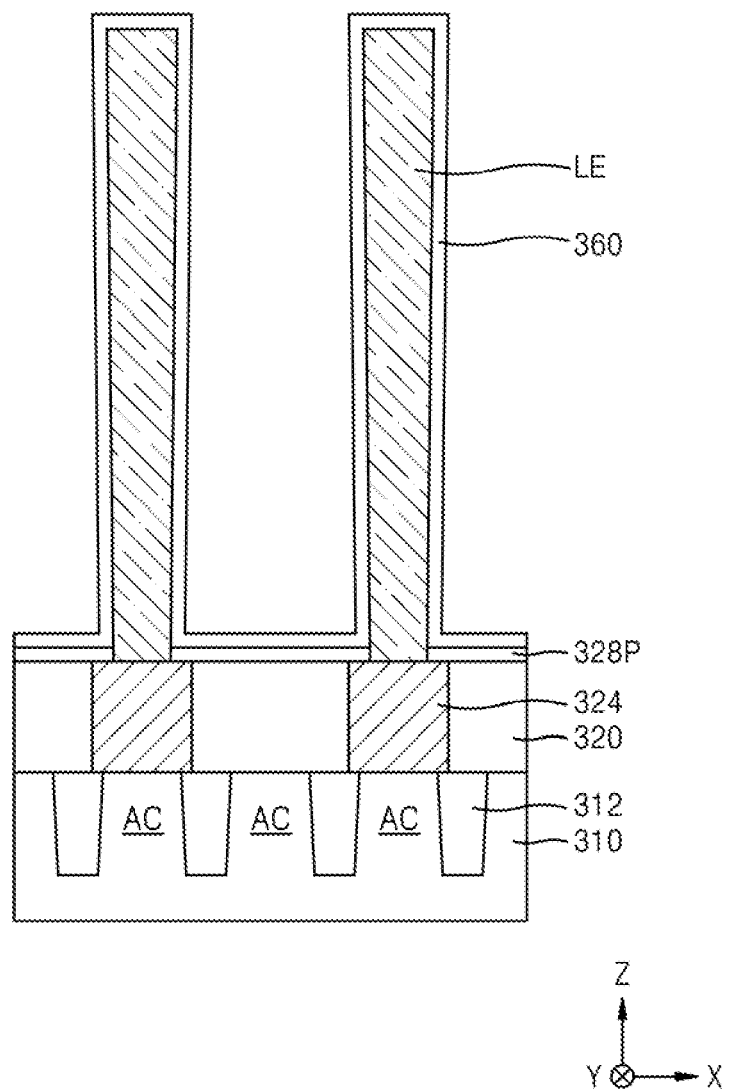

Referring to FIG. 4I, a dielectric film 360 may be formed on the plurality of lower electrodes LE.

The dielectric film 360 may conformally cover exposed surfaces of the plurality of lower electrodes LE.

In an implementation, the dielectric film 360 may include hafnium oxide, hafnium oxynitride, hafnium silicon oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof. The dielectric film 360 may be formed by an ALD process. In an implementation, to form at least a portion of the dielectric film 360, a metal-containing film may be formed using process P20 of FIG. 1 or the method described with reference to FIG. 2. In an implementation, the dielectric film 360 may include a tantalum oxide film, which may be a film formed using process P20 of FIG. 1 or the method described with reference to FIG. 2. Any one of the deposition systems 200A, 200B, 200C, and 200D shown in FIGS. 3A to 3D may be used to form the dielectric film 360. The dielectric film 360 may have a thickness of about 50 Å to about 150 Å.

In an implementation, before the dielectric film 360 is formed on the plurality of lower electrodes LE as described with reference to FIG. 4I, a process of forming a lower interface film to cover a surface of each of the plurality of lower electrodes LE may be further performed. In this case, the dielectric film 360 may be formed on the lower interface film. The lower interface film may include a metal-containing film including niobium, tantalum, or vanadium. The metal-containing film included in the lower interface film may be formed using process P20 of FIG. 1 or the method described with reference to FIG. 2. Any one of the deposition systems 200A, 200B, 200C, and 200D shown in FIGS. 3A to 3D may be used to form the lower interface film.

Figure 4J:
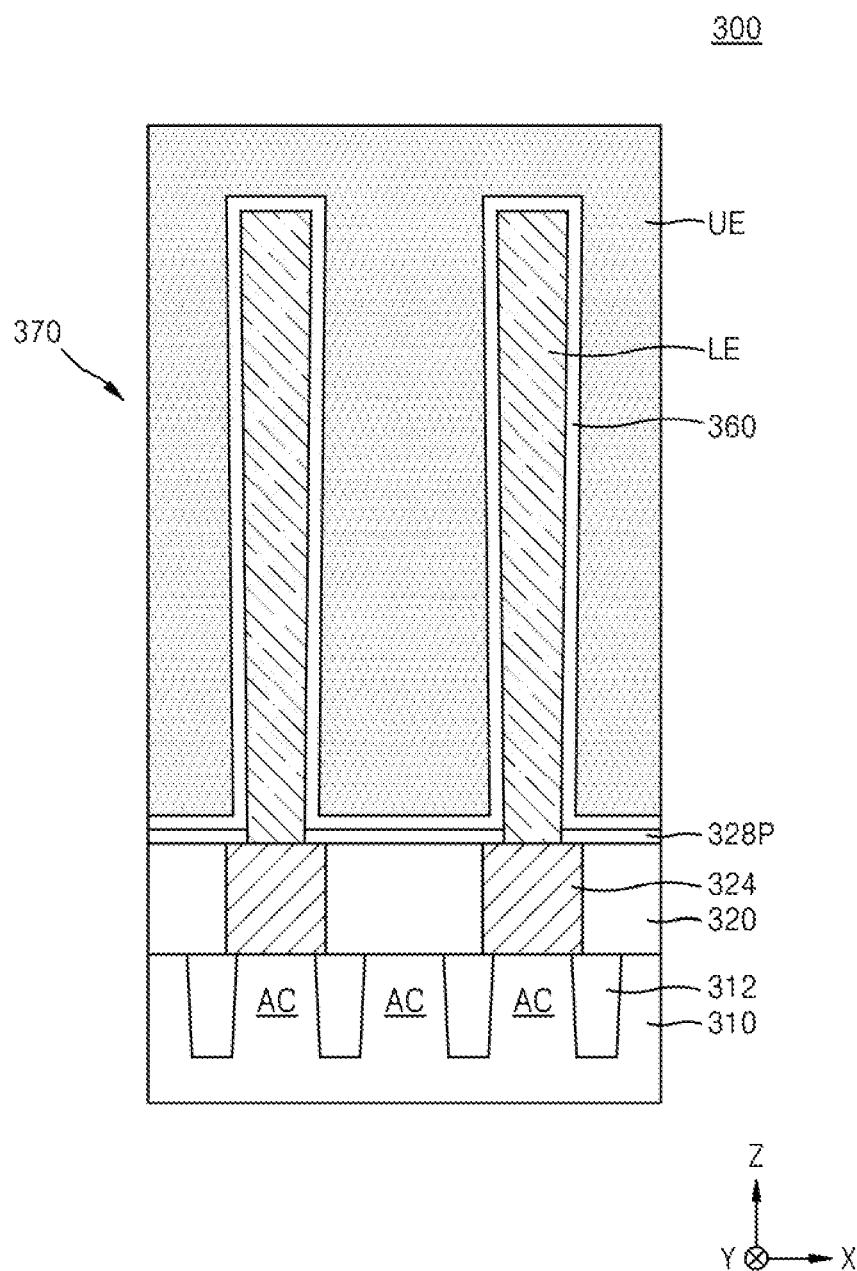

Referring to FIG. 4J, an upper electrode UE may be formed on the dielectric film 360. The lower electrode LE, the dielectric film 360, and the upper electrode UE may constitute a capacitor 370.

The upper electrode UE may include a doped semiconductor, a conductive metal nitride, a metal, a metal silicide, a conductive oxide, or a combination thereof. In an implementation, the upper electrode UE may include NbN, TiN, TiAlN, TaN, TaAlN, W, WN, Ru, $RuO_2$, $SrRuO_3$, Ir, $IrO_2$, Pt, PtO, SRO($SrRuO_3$), BSRO(Ba,Sr)$RuO_3$), CRO ($CaRuO_3$), LSCo((La,Sr)$CoO_3$), or a combination thereof. The upper electrode UE may be formed using a CVD process, an MOCVD process, a physical vapor deposition (PVD) process, or an ALD process.

In an implementation, to form the upper electrode UE, a metal-containing film may be formed using process P20 of FIG. 1 or the method described with reference to FIG. 2. Any one of the deposition systems 200A, 200B, 200C, and 200D shown in FIGS. 3A to 3D may be used to form the upper electrode UE.

In an implementation, before the upper electrode UE is formed on the dielectric film 360 as described with reference to FIG. 4J, a process of forming an upper interface film to cover a surface of the dielectric film 360 may be further performed. In this case, the upper electrode UE may be formed on the upper interface film. The upper interface film may include a metal-containing film including niobium, tantalum, or vanadium. The metal-containing film included in the upper interface film may be formed using process P20 of FIG. 1 or the method described with reference to FIG. 2. Any one of the deposition systems 200A, 200B, 200C, and 200D shown in FIGS. 3A to 3D may be used to form the upper interface film.

In an implementation, in the method of manufacturing the IC device 300, as illustrated in FIGS. 4A to 4J, each of the plurality of lower electrodes LE may have a pillar shape. In an implementation, each of the plurality of lower electrodes LE may have a cup-shaped sectional structure or a cylindrical sectional structure with a blocked bottom portion.

In the IC device 300 manufactured by using the method described with reference to FIGS. 4A to 4J, the capacitor 370 may include the lower electrodes LE having a 3D electrode structure. In order to compensate for a capacitance reduction due to a reduction in the design rule, an aspect ratio of the lower electrode LE having a 3D structure is increasing, and an ALD process may be used to form the dielectric film 360 having a good quality in a deep, narrow 3D space. In the method of manufacturing the IC device 300 according to the embodiments, which is described with reference to FIGS. 4A to 4J, the lower electrodes LE, the dielectric film 360, or the upper electrode UE may be formed using the organometallic adduct compound of General formula (I), according to the embodiment, and thus, process stability may be improved.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example 1

Synthesis of the Compound of Formula 2

9.40 g (50.0 mmol) of niobium pentafluoride and 250 mL of dehydrated dichloromethane were put in a 500-mL 4-neck flask under an argon (Ar) atmosphere, and the obtained liquid was stirred while being maintained at a temperature of about 25° C. Thereafter, 17.7 g (51.5 mmol) of tris(2,2,2-trifluoroethyl) phosphate was added dropwise at ambient temperature and stirred for about 5 hours. A solvent and unreacted tris(2,2,2-trifluoroethyl)phosphate were distilled under reduced pressure and then distilled and purified to obtain 10.2 g of a target product (yield 38.2%).
(Analysis Values)
(1) 1H-NMR (Heavy Benzene)
  3.70 ppm (6H, multiplet)
(2) Analysis of Elements (Theoretical Value)
  Nb: 17.9% (17.5%), C: 14.0% (13.6%), H: 1.6% (1.1%), F: 50.7% (50.0%), P: 6.1% (5.8%)

Synthesis Example 2

Synthesis of the Compound of Formula 6

13.5 g (50.0 mmol) of niobium pentachloride and 300 mL of dehydrated dichloromethane were put in a 500-mL 4-neck flask under an argon atmosphere, and the obtained liquid was stirred while being maintained at a temperature of about 25° C. Thereafter, 17.7 g (51.5 mmol) of tris(2,2,2-trifluoroethyl) phosphate was added dropwise at ambient temperature and stirred for about 5 hours. A solvent and unreacted tris(2,2,2-trifluoroethyl)phosphate were distilled under reduced pressure and then distilled and purified to obtain 28.0 g of a target product (yield 91.2%).
(Analysis Values)
(1) 1H-NMR (Heavy Benzene)
  3.87 ppm (6H, doublet of quartet)
(2) Analysis of Elements (Theoretical Value)
  Nb: 15.5% (15.1%), C: 12.0% (11.7%), H: 1.4% (1.0%), Cl: 29.3% (28.9%), F: 28.2% (27.8%), P: 5.1% (5.0%)

Synthesis Example 3

Synthesis of the Compound of Formula 7

13.5 g (50.0 mmol) of niobium pentachloride and 300 mL of dehydrated dichloromethane were put in a 500-mL 4-neck flask under an argon atmosphere, and the obtained liquid was stirred while being maintained at a temperature of about 25° C. Thereafter, 28.2 g (51.5 mmol) of tris(1,1,1,3,3,3-hexafluoro-2-propyl) phosphate was added dropwise at ambient temperature and stirred for about 5 hours. A solvent and unreacted tris(1,1,1,3,3,3-hexafluoro-2-propyl)phosphate were distilled under reduced pressure and then distilled and purified to obtain 20.5 g of a target product (yield 50.2%).
(Analysis Values)
(1) 1H-NMR (Heavy Benzene)
  4.81 ppm (3H, singlet, broad)
(2) Analysis of Elements (Theoretical Value)
  Nb: 11.5% (11.4%), C: 13.5% (13.2%), H: 0.8% (0.4%), Cl: 22.0% (21.7%), F: 42.0% (41.8%), P: 4.1% (3.8%)

Synthesis Example 4

Synthesis of the Compound of Formula 14

17.9 g (50.0 mmol) of $TaCl_5$ and 300 mL of dehydrated dichloromethane were put in a 500-mL 4-neck flask under an argon atmosphere, and the obtained liquid was stirred while being maintained at a temperature of about 25° C. Thereafter, 17.7 g (51.5 mmol) of tris(2,2,2-trifluoroethyl) phosphate was added dropwise at ambient temperature and stirred for about 5 hours. A solvent and unreacted tris(2,2,2-trifluoroethyl) phosphate were distilled under reduced pressure and then distilled and purified to obtain 30.9 g of a target product (yield 87.9%).

(Analysis Values)
(1) 1H-NMR (Heavy Benzene)
  3.85 ppm (6H, doublet of quartet)
(2) Analysis of Elements (Theoretical Value)
  Ta: 25.9% (25.8%), C: 10.7% (10.3%), H: 1.1% (0.9%), Cl: 25.7% (25.2%), F: 24.6% (24.4%), P: 4.4% (4.4%)

Examples 1 to 4 and Comparative Examples 1 to 4

Next, a thermogravimetry-differential thermal analysis (TG-DTA) 50% mass reduction temperature T1 (under normal pressure), a phase (at 25° C.), and a melting point of each of the Compounds of Formulae 2, 6, 7, and 14, which were obtained in Synthesis Examples 1 to 4, and the following Comparative Compounds 1 to 4 were determined as follows.

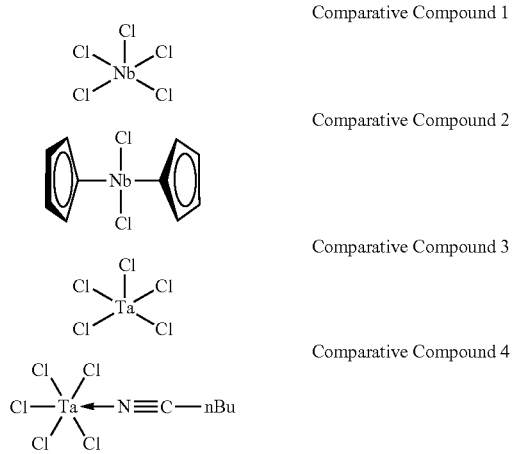

Comparative Compound 1

Comparative Compound 2

Comparative Compound 3

Comparative Compound 4

"nBu" refers to a normal butyl group.

(1) TG-DTA Under Normal Pressure

Under conditions of normal pressure, an Ar flow rate of 100 mL/min, a heating rate of 10° C./min, and a scanning temperature range of about 30° C. to about 600° C., a 50% mass reduction temperature T1 of each of the Compounds of Formulae 2, 6, 7, and 14, which were obtained in Synthesis Examples 1 to 4, and the Comparative Compounds 1 to 4 was measured using a TG-DTA technique, and measurement results thereof are shown in Table 1.

(2) Melting Points of Compounds

Results obtained by visually observing phases of the Compounds of Formulae 2, 6, 7, and 14, which were obtained in Synthesis Examples 1 to 4, and the Comparative Compounds 1 to 4 at a temperature of about 25° C. are shown in Table 1. Table 1 also shows results obtained by measuring melting points of compounds that are solid at the temperature of about 25° C.

TABLE 1

| Example | Metal type | Compound | T1 (° C.) | Phase at 25° C. | Melting point (° C.) |
|---|---|---|---|---|---|
| Example 1 | Nb | Formula 2 | 181 | Liquid | — |
| Example 2 | | Formula 6 | 210 | Liquid | — |
| Example 3 | | Formula 7 | 150 | Liquid | — |
| Comparative Example 1 | | Comparative Compound 1 | 184 | Solid | 205 |
| Comparative Example 2 | | Comparative Compound 2 | 379 | Solid | 359 |
| Example 4 | Ta | Formula 14 | 215 | Liquid | — |
| Comparative Example 3 | | Comparative Compound 3 | 181 | Solid | 220 |
| Comparative Example 4 | | Comparative Compound 4 | 245 | Solid | 119 |

From the results of Table 1, the 50% mass reduction temperature T1 of each of the Compounds of Formulae 2, 6, 7, and 14, which was measured using a TG-DTA technique under normal pressure, was about 215° C. or lower, and thus, the Compounds of Formulae 2, 6, 7, and 14 had relatively high vapor pressures. Also, all the Compounds of Formulae 2, 6, 7, and 14 were liquids at a temperature of about 25° C. and had melting points lower than about 25° C.

In contrast, each of the Comparative Compounds 1 to 4 had a relatively high melting point of about 115° C. or higher. The 50% mass reduction temperature T1 of each of the comparative compounds 1 and 3, which was measured using the TG-DTA technique under normal pressure, was about 180° C., and thus, the Comparative Compounds 1 and 3 were compounds having relatively high vapor pressures similar to those of the compounds according to the embodiments. However, the Comparative Compounds 1 and 3 had very high melting points of about 205° C. or higher.

Examples 5 to 8 and Comparative Examples 5 to 8
(Formation of a Metal-Containing Film)

Next, a niobium nitride film or tantalum nitride film was formed on a silicon substrate using each of the Compounds of Formulae 2, 6, 7, and 14, which were obtained in Synthesis Examples 1 to 4 and the Comparative Compounds 1 to 4 as a source and using the deposition system of FIG. 3A. Conditions of an ALD process for forming the niobium nitride film or tantalum nitride film were as follows.

<Conditions>
Reaction temperature (substrate temperature): 250° C.
Reactive gas: ammonia gas
<Process>

One cycle including a series of processes (1) to (4) described below was repeated 150 times under the above-described conditions.

Process (1): Vapor generated by vaporizing a source under conditions where a source container was heated to a temperature of about 90° C. and maintained under an inner pressure of about 100 Pa was introduced into a chamber, and a niobium nitride film or tantalum nitride film was deposited for about 30 seconds in the chamber, which was maintained under pressure of about 100 Pa.

Process (2): An argon (Ar) purge process was performed for about 10 seconds to remove unreacted sources from the chamber.

Process (3): A reactive gas was supplied into the chamber to cause a reaction for about 30 seconds under pressure of about 100 Pa.

Process (4): An argon purge process was performed for about 10 seconds to remove unreacted sources from the chamber.

A thickness of each of thin films obtained using the processes (1) to (4) was measured using an X-ray reflectivity technique, and a compound of each of the obtained thin films was confirmed using an X-ray diffraction technique. A carbon content of each of the obtained thin films was measured using an X-ray photoelectron spectroscopy (XPS) technique, and measurement results thereof are shown in Table 2.

TABLE 2

| Example | Compound | Thickness of thin film (nm) | Compound of thin film | Carbon content |
|---|---|---|---|---|
| Example 5 | Formula 2 | 5.5 | NbN | Not detected |
| Example 6 | Formula 6 | 8.5 | NbN | Not detected |
| Example 7 | Formula 7 | 5.0 | NbN | Not detected |
| Comparative Example 5 | Comparative Compound 1 | 2.5 | NbN | Not detected |
| Comparative Example 6 | Comparative Compound 2 | 3.0 | NbN | 6 at % |
| Example 8 | Formula 14 | 8.0 | TaN | Not detected |
| Comparative Example 7 | Comparative Compound 3 | 2.0 | TaN | Not detected |
| Comparative Example 8 | Comparative Compound 4 | 2.5 | TaN | 7 at % |

As may be seen from the results of Table 2, a carbon content of each of thin films obtained using the Comparative Compounds 2 and 4, from among the thin films obtained using the ALD process, was 6 atomic percent (at %) or more. In contrast, a carbon content of each of the thin films obtained using the Compounds of Formulae 2, 6, 7, and 14 was about 0.1 at % or less, which was a detection limit. Thus, the thin films obtained using the Compounds of Formulae 2, 6, 7, and 14 were thin films of good quality. In addition, as a result of estimating thicknesses of the thin films obtained after 150 cycles of the ALD process, each of the thin films obtained using the Comparative Compounds 1, 2, 3, and 4 was about 3 nm or less, and each of the thin films obtained using the Compounds of Formulae 2, 6, 7, and 14 was about 5.0 nm or more. Thus, it may be seen that the productivity of a thin film forming process was excellent.

As may be seen from the Examples, the organometallic adduct compounds according to Examples 1 to 8 had low melting points, high vapor pressures, and helped increase the productivity of thin-film forming processes when the organometallic adduct compounds are used as sources in an ALD process or a CVD process for forming thin films.

By way of summation and review, source compounds for forming metal-containing films should provide excellent gap-fill characteristics and step coverage characteristics during the formation of a metal-containing film for the manufacture of an IC device, and be advantageous in terms of process stability and mass productivity due to handling easiness thereof.

One or more embodiments may provide an organometallic adduct compound including niobium, tantalum, or vanadium as a metal.

One or more embodiments may provide an organometallic adduct compound, which may be used as a source compound capable of providing excellent thermal stability, process stability, and mass productivity during the formation of a metal-containing film for the manufacture of an integrated circuit (IC) device.

One or more embodiments may provide a method of manufacturing an IC device, by which a metal-containing film of good quality may be formed using a metal-containing source compound capable of providing excellent process stability and mass productivity to provide desired electrical properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organometallic adduct compound represented by General formula (I):
wherein, in General formula (I),

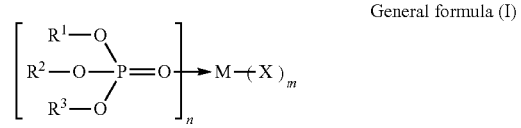

General formula (I)

$R^1$, $R^2$, and $R^3$ are each independently a C1 to C5 alkyl group, at least one of $R^1$, $R^2$, and $R^3$ being a branched C3 to C5 alkyl group in which at least one hydrogen atom is substituted with a fluorine atom, M is a niobium atom, a tantalum atom, or a vanadium atom, X is a halogen atom, m is an integer of 3 to 5, and n is 1 or 2.

2. The organometallic adduct compound as claimed in claim 1, wherein, in General formula (I):

M is a niobium atom or a tantalum atom, and

X is a fluorine atom or a chlorine atom.

3. The organometallic adduct compound as claimed in claim 1, wherein $R^1$, $R^2$, and $R^3$ are each independently a hexafluoroisopropyl group or a nonafluoro tert-butyl group.

4. The organometallic adduct compound as claimed in claim 1, wherein in General formula (I), m is 5, and n is 1.

5. The organometallic adduct compound as claimed in claim 1, wherein, in General formula (I):

M is a niobium atom or a tantalum atom,

X is a fluorine atom, and $R^1$, $R^2$, and $R^3$ are each independently a branched C3 to C5 alkyl group.

6. The organometallic adduct compound as claimed in claim 1, wherein, in General formula (I):

M is a niobium atom or a tantalum atom,

X is a chlorine atom, and $R^1$, $R^2$, and $R^3$ are each independently a branched C3 to C5 alkyl group in which all hydrogen atoms are substituted with fluorine atoms.

7. The organometallic adduct compound as claimed in claim 1, wherein, in General formula (I):

M is a niobium atom or a tantalum atom,

X is a fluorine atom, and

R¹, R², and R³ are each independently a branched C3 to C5 alkyl group in which all hydrogen atoms are substituted with fluorine atoms.

8. The organometallic adduct compound as claimed in claim 1,
wherein the organometallic adduct compound is a liquid at about 20° C. to about 28° C.

9. A method of manufacturing an integrated circuit (IC) device, the method comprising forming a metal-containing film on a substrate using an organometallic adduct compound represented by General formula (I),

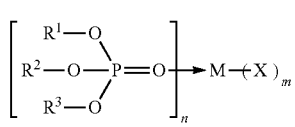

General formula (I)

wherein, in General formula (I),
R¹, R², and R³ are each independently a C1 to C5 alkyl group, at least one of R1, R2, and R3 being a branched C3 to C5 alkyl group in which at least one hydrogen atom is substituted with a fluorine atom,
M is a niobium atom, a tantalum atom, or a vanadium atom,
X is a halogen atom,
m is an integer of 3 to 5, and
n is 1 or 2.

10. The method as claimed in claim 9, wherein the organometallic adduct compound is a liquid at about 20° C. to about 28° C.

11. The method as claimed in claim 9, wherein, in General formula (I):
M is a niobium atom or a tantalum atom, and
X is a fluorine atom or a chlorine atom.

12. The method as claimed in claim 9, wherein R¹, R², and R³ are each independently a hexafluoroisopropyl group or a nonafluoro tert-butyl group.

13. The method as claimed in claim 9, wherein, in General formula (I), m is 5, and n is 1.

14. The method as claimed in claim 9, wherein forming the metal-containing film includes:
supplying the organometallic adduct compound of General formula (I) onto the substrate; and
supplying a reactive gas onto the substrate.

15. The method as claimed in claim 14, wherein the reactive gas includes NH₃, N₂ plasma, an organic amine compound, a hydrazine compound, or a combination thereof.

16. The method as claimed in claim 14, wherein the reactive gas includes O₂, O₃, O₂ plasma, H₂O, NO₂, NO, N₂O, CO, CO₂, H₂O₂, HCOOH, CH₃COOH, (CH₃CO)₂O, an alcohol, a peroxide, sulfur oxide, or a combination thereof.

17. The method as claimed in claim 14, wherein the reactive gas includes H₂.

* * * * *